(12) United States Patent
Kataoka et al.

(10) Patent No.: US 8,359,117 B2
(45) Date of Patent: Jan. 22, 2013

(54) SUBSTRATE PROCESSING SYSTEM

(75) Inventors: Norihiko Kataoka, Toyama (JP); Shinichiro Mori, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 178 days.

(21) Appl. No.: 12/647,929

(22) Filed: Dec. 28, 2009

(65) Prior Publication Data
US 2010/0199001 A1 Aug. 5, 2010

(30) Foreign Application Priority Data

Jan. 6, 2009 (JP) ................................. 2009-001090
Dec. 24, 2009 (JP) ................................. 2009-292804

(51) Int. Cl.
*G06F 19/00* (2006.01)
(52) U.S. Cl. .................... 700/108; 700/121; 700/110
(58) Field of Classification Search .................. 700/108, 700/223, 228, 121, 110, 115, 101, 97, 112, 700/169; 702/127, 82; 118/725; 62/196.4
See application file for complete search history.

(56) References Cited

U.S. PATENT DOCUMENTS

| | | | | |
|---|---|---|---|---|
| 4,298,954 A | * | 11/1981 | Bigelow et al. | 710/53 |
| 4,318,172 A | * | 3/1982 | Yamada et al. | 711/118 |
| 4,463,443 A | * | 7/1984 | Frankel et al. | 710/60 |
| 5,450,546 A | * | 9/1995 | Krakirian | 710/57 |
| 5,898,588 A | * | 4/1999 | Morimoto | 700/108 |
| 6,526,547 B2 | * | 2/2003 | Breiner et al. | 716/56 |
| 6,662,066 B1 | * | 12/2003 | Yu et al. | 700/108 |
| 6,691,068 B1 | * | 2/2004 | Freed et al. | 702/187 |
| 6,776,872 B2 | * | 8/2004 | Tanaka et al. | 156/345.24 |
| 6,868,353 B1 | * | 3/2005 | Ryskoski | 702/84 |
| 7,490,100 B2 | * | 2/2009 | Dettinger et al. | 1/1 |
| 7,637,114 B2 | * | 12/2009 | Choi et al. | 62/196.4 |
| 2004/0177924 A1 | * | 9/2004 | Tanaka et al. | 156/345.24 |
| 2006/0259259 A1 | * | 11/2006 | Rozenboim et al. | 702/83 |
| 2006/0266060 A1 | * | 11/2006 | Choi et al. | 62/196.1 |

FOREIGN PATENT DOCUMENTS

| | | |
|---|---|---|
| JP | 11-355256 | 12/1999 |
| JP | 2004-260380 | 9/2004 |

OTHER PUBLICATIONS

Automatic Data Collection Baseline Requirements Level 1 and Level 2 Events and Variables, 2000, Internatnal SEMATECH Inc., p. 1-38.*

* cited by examiner

*Primary Examiner* — Kidest Bahta
(74) *Attorney, Agent, or Firm* — Brundidge & Stanger, P.C.

(57) ABSTRACT

Provided is a substrate processing system configured to provide proper data. The substrate processing system comprises a substrate processing apparatus comprising a plurality of components, a controller configured to control the substrate processing apparatus by setting a sequence prescribing time and components, and a collection unit configured to collect data from the components. The collection unit is configured to match data collected from the components via the controller with data collected directly from the components.

5 Claims, 24 Drawing Sheets

STORED DATA TABLE

| # | PARAMETER NAME | C2 | PARAMETER VALUE | ACTUAL COLLECT TIME | CU RECEIVING TIME | ΔT |
|---|---|---|---|---|---|---|
| 1 | Equipment Status | False | "Run" | 2005/4/1 12:00:00.001 | – | – |
| 2 | MC1.MC Status | False | "Busy" | 2005/4/1 12:00:00.015 | – | – |
| | ... | | | | | |
| 103 | MC1.Aux20. Monitor | True | 4.895 | 2005/4/1 12:00:00.585 | 2005/4/1 12:00:00.716 | 0.130 |
| 104 | MC1.Aux20. Designate | True | 5.000 | 2005/4/1 12:00:00.585 | 2005/4/1 12:00:00.715 | 0.130 |
| | ... | | | | | |

REPORT PARAMETER LIST

| # | PARAMETER NAME |
|---|---|
| 1 | EquipmentStatus |
| 103 | MC1.Aux20.Monitor |

Fig. 13

1 EquipmentStatus
STORED DATA TABLE

| # | PARAMETER NAME | C2 | PARAMETER VALUE | ACTUAL COLLECT TIME | CU RECEIVING TIME | ⊿T |
|---|---|---|---|---|---|---|
| 1 | EquipmentStatus | False | "Run" | 2005/4/1 12:00:00.001 | – | –1 |

REFER TO C2 AREA→FALSE

Fig. 14

REPORT DATA WORK TABLE

| # | PARAMETER NAME | PARAMETER VALUE | COLLECT TIME |
|---|---|---|---|
| 1 | EquipmentStatus | "Run" | 2005/4/1 12:00:00.001 |
| 103 | MC1.Aux20.Monitor | | |

Fig. 15

103 MC1.Aux20.Moniter
STORED DATA TABLE

| # | PARAMETER NAME | C2 | PARAMETER VALUE | ACTUAL COLLECT TIME | CU RECEIVING TIME | ⊿T |
|---|---|---|---|---|---|---|
| 103 | MC1.Aux20.Monitor | True | 4.895 | 2005/4/1 12:00:00.585 | 2005/4/1 12:00:00.715 | 0.130 |

REFER TO C2 AREA→TURE

REPORT DATA WORK TABLE

| # | PARAMETER NAME | PARAMETER VALUE | COLLECT TIME |
|---|---|---|---|
| 1 | EquipmentStatus | "Run" | 2005/4/1 12:00:00.001 |
| 103 | MC1.Aux20.Monitor | 4.998 | 2005/4/1 12:00:00.800 |

SUBSTRATE PROCESSING SYSTEM

CROSS-REFERENCE TO RELATED PATENT APPLICATION

This U.S. non-provisional patent application claims priority under 35 U.S.C. §119 of Japanese Patent Application Nos. 2009-001090, filed on Jan. 6, 2009, and 2009-292804, filed on Dec. 24, 2009, in the Japanese Patent Office, the entire contents of which are hereby incorporated by reference.

BACKGROUND OF THE INVENTION

1. Field of the Invention

The present invention relates to a substrate processing system, and more particularly, to a substrate processing system suitable for collecting data from a substrate processing apparatus at a high frequency.

2. Description of the Prior Art

A substrate processing apparatuses such as a semiconductor manufacturing apparatus is configured by a number of components, and since lifetimes or failure rates of the components are different, a process for stably operating the components of the semiconductor manufacturing apparatus is a key process in semiconductor manufacture. Therefore, current semiconductor manufacturing factories are required to collect data very frequently from semiconductor manufacturing systems for the purposes of manufacturing management, performance and operation rate/fault detection management.

However, in a system configured to control a semiconductor manufacturing apparatus, since more components are required to be timely controlled at a high frequency, it is difficult for the system using an existing structure to output collected data at a high frequency level required by a semiconductor manufacturing factory.

In a conventional method, data are collected directly to an external storage medium, and the collected data are used by offline (for example, refer to Patent Document 1). However, this method is not preferable in the current online.

So as to perform a film-forming process on a semiconductor substrate, a semiconductor manufacturing system sets a sequence prescribing time and components. For example, the semiconductor manufacturing system performs a controlling operation in accordance with a recipe. Such a recipe prescribes a control sequence of temperature/pressure/gas for a furnace in which a film is formed on a semiconductor substrate, and sub controllers such as a temperature controller and a pressure controller, or other components such as an MFC or a valve used to select gas or control the flowrate of gas are sequentially controlled according to the recipe. In some semiconductor manufacturing systems, driving control for loading and unloading a semiconductor substrate on which a film is to be formed into and away from a furnace is also prescribed in a recipe FIG. 22 illustrates the structure of a conventional substrate processing system.

In the drawing, MCs 30A and 30B are module controllers configured to control a substrate processing apparatus 10. An OU 40 is an operation unit configured to edit recipes. Transportation of a semiconductor substrate to/from a semiconductor manufacturing apparatus, selection from a plurality of recipes, and starting operation can be regulated by the OU 40; however, automation of these operations is increased in the recent online and requests from a HOST 60 installed in a semiconductor factory. Interface between a semiconductor manufacturing apparatus system and a semiconductor manufacturing factory is carried out by an HU 50. Generally, the substrate processing apparatus 10, the MCs 30A and 30B, the OU 40, the HU 50, and the HOST 60 are connected through a network.

However, since the above-described substrate processing system is connected through a general network connection, data such as temperature, pressure, gas, and driving control data could not be collected at a high speed.

Therefore, for the purpose of high speed data collection, recent semiconductor manufacturing factories require installation of another port different from the conventional HU 50 in a substrate processing system. An exemplary substrate processing system including an exclusive CU 70 for satisfying the requirement is exemplary illustrated in FIG. 23.

In FIG. 23, an MC 30 and a substrate processing apparatus 10 are connected not through a general network such as ETHERNET but through a wiring saving system network (field network) specialized in device control. In addition, data acquired by the CU 70 is usually stored in a DB 80 so that the data can be extracted/analyzed at a proper time by a semiconductor manufacturing factory.

In addition, the HOST 60 or the DB 80 requires reports about various phenomena (events) or abnormal situations (exceptional situations) as well as trace data that can be collected from various components or the MC 30 to monitor apparatus conditions.

When an event or an exception occurs in the substrate processing system, it is necessary to perform a response operation such as performing the next operation of the event or stopping the system upon the exception. In addition, since it is necessary to properly manage the occurrence order of trace data/events/exceptions or the adjustment between the data, such data are required to be collected to the same place of the system. Thereafter, the data are sent to the HOST 60 or the DB 80 through the HU 50 or the CU 70.

However, in the substrate processing system, high-precision and high-frequency data transmission are difficult although the HOST 60 or the DB 80 requires high-precision and high-frequency data transmission for managing the occurrence order of data such as trace data/events/exceptions or the adjustment of such data. For example, in a substrate processing system, collection frequency of about 1 time/1 sec to 1 time/500 ms may be usually required as a necessary/sufficient control condition although the collection frequency may be varied according to the kinds of components or data. In some cases, data are collected at intervals of 100 ms or a higher frequency. However, such a collection frequency is merely for controlling operations and is usually internal collection frequency of the MC 30. In the case where high-precision and high-frequency data are transmitted to the HOST 60 or the DB 80 as well as the OU 40, since it is necessary to transmit the data at a high rate while continuously executing a plurality of programs, system load increases if even the OU 40 or CU 70 is involved in such transmission.

[Patent Document 1] Japanese Patent No. 3630245

As described above, in a conventional substrate processing system, so as to realize high-precision and high-frequency data transmission, it is necessary to transmit data at a high rate while continuously executing a plurality of programs. However, since actual practice of this data transmission results in system load problems, it is difficult to provide appropriate data while properly managing data occurrence order of the data collected from various components or adjustment between the data.

SUMMARY OF THE INVENTION

An object of the present invention is to obviate the above-described technical limitations of the related art by provide a substrate processing system capable of providing proper data.

According to an aspect of the present invention, there is provided a substrate processing system comprising: a substrate processing apparatus comprising a plurality of components; a controller configured to control the substrate processing apparatus by controlling the plurality of components according to a recipe defining a sequence and a time of an operation of each of the plurality of components; and a collection unit configured to collect and match a first data and a second data, the first data being indirectly collected from the plurality of components via the controller and the second data being collected directly from the plurality of components.

According to another aspect of the present invention, there is provided a substrate processing system comprising a collection unit configured to collect data generated from a plurality of components indirectly through controllers, the collection unit comprising: a buffer configured to store a collected data for a predetermined time so as to absorb a delay occurring when collecting data indirectly through the controllers; and a part configured to arrange the collected data stored in the buffer according to a collected time, wherein the collected data is stored in the buffer when the collected time of the collected data is within a predetermined range from a newest collected time and the collected data is stored in a new buffer when the collected time of the collected data is out of the predetermined range.

BRIEF DESCRIPTION OF THE DRAWINGS

FIG. 13 is a view for explaining #1 EquipmentStatus of the stored data table according to the first embodiment of the present invention.

FIG. 14 is a view illustrating a report work table according to the first embodiment of the present invention.

FIG. 15 is a view for explaining #103 MC1.Aux20.Monitor of the stored data table according to the first embodiment of the present invention.

DETAILED DESCRIPTION OF THE PREFERRED EMBODIMENTS

Hereinafter, an embodiment of the present invention will be described.

First Embodiment

Overview of First Embodiment

According to the current embodiment, there are provided: a substrate processing apparatus including a plurality of components, a controller configured to control the substrate processing apparatus by setting a sequence prescribing time and components, and a collection unit configured to collect data from the components. The collection unit matches data collected from the components via the controller with data collected directly from the components. This matching of various data makes it possible to manage occurrence order of the data or matching between the data.

Herein, matching is adjusting occurrence times of various collected data (regardless of collection routes).

Hereinafter, the first embodiment will be described in detail.

(1-1) Structure of Substrate Processing System

First, with reference to FIG. 1, the structure of a substrate processing system will be described according to an embodiment of the present invention.

Figure 1:
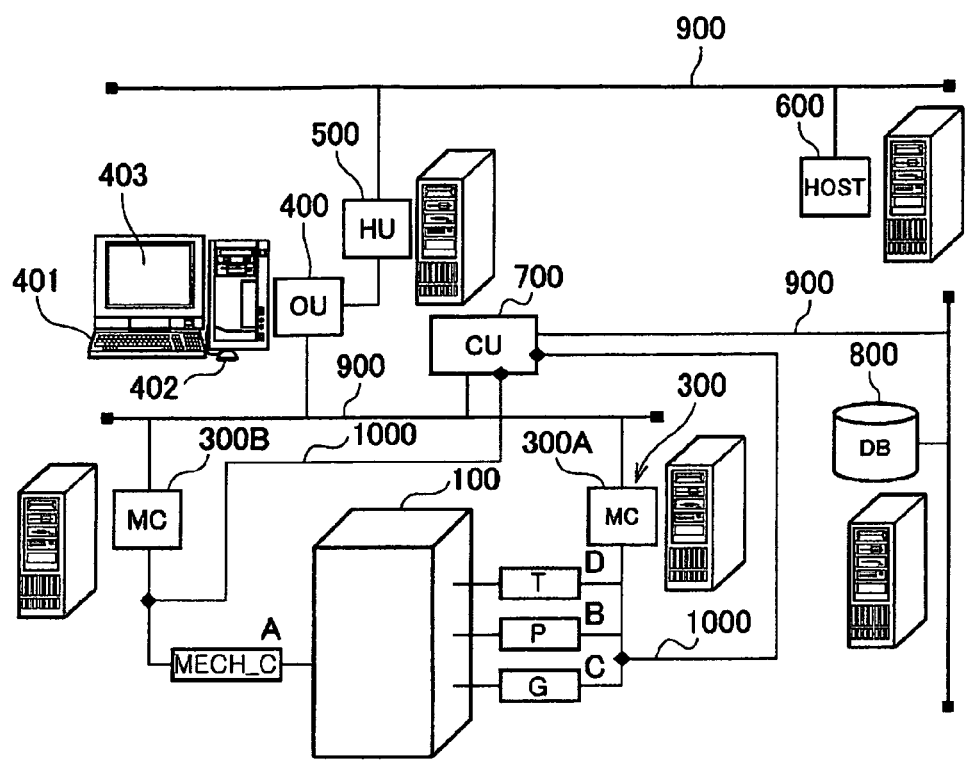
FIG. 1 is a view illustrating a substrate processing system according to a first embodiment of the present invention.

As shown in FIG. 1, the substrate processing system includes a substrate processing apparatus 100, module controller (MC) 300 as a control device, an operation unit (OU) 400 as a terminal device, a host interface (I/F) unit (HU) 500, a host computer (HOST) 600, a collection unit (CU) 700, and a database (DB) 800. The substrate processing system is a distributed processing system configured to transmit data acquired from the substrate processing apparatus to the HOST 600 or the DB 800 located at a semiconductor manufacturing factory side distant from a location where the substrate processing system is installed.

For example, the substrate processing apparatus 100 is configured as a semiconductor manufacturing apparatus configured to manufacture semiconductor devices. The substrate processing apparatus 100 is configured by a plurality of components. Each component of the substrate processing apparatus 100 generates data.

Herein, the term "component(s)" means any part constituting the substrate processing apparatus, such as driving control parts (e.g., a carrying control part or a temperature control part), sensors, and actuators. The term "data" mean setting or measured item(s) of any component. For example, in the case of a thermocouple, data mean a monitored (measured) value, and in the case of a mass flow controller (MFC), data mean a setting or monitored (measured) value or a valve voltage.

The substrate processing apparatus 100 receives a recipe transmitted from the HOST 600 and performs a processing process based on the recipe. Such a recipe contains a substrate processing sequence so that the MC 300 can control each component of the substrate processing apparatus 100 based on the recipe constituted by a plurality of steps. The substrate processing apparatus 100 will be described later in detail.

The MC 300 is installed between the substrate processing apparatus 100 and the OU 400 through a field network 1000. Each component of the substrate processing apparatus 100 is controlled by the MC 300. The MC 300 is a controller configured to perform a necessary control operation on the substrate processing apparatus 100 by setting a control sequence prescribing time and components to process a substrate, for example, according to a recipe. As many MCs 300 are provided as required by the system, for example, an MC 300 for controlling a substrate processing process such as a film-forming process and an MC 300 for controlling a mechanism configured to transport a semiconductor substrate or a carrier in which a plurality of semiconductor substrates are accommodated. In the illustrated example, two MCs 300 are provided: a temperature/pressure/gas MC 300A for controlling a film-forming process and a driving control MC 300B for controlling a mechanism configured to transport a carrier or other devices. The MC 300 will be described later in more detail.

The OU 400 is a terminal device configured to edit a desired recipe. In addition, the OU 400 is configured to collect various data generated from various components through the MC 300. The OU 400 is connected to the MC 300 through a general network 900. The OU 400 includes input/output devices such as a keyboard 401 and a mouse 402, and a manipulation screen 403. The manipulation screen 403 provides an input screen so that an operator can input predetermined data, and a display screen to display states such as apparatus states.

The HU 500 is an interface (I/F) between the substrate processing system and the semiconductor manufacturing factory. The HU 500 transmits data collected from the substrate processing apparatus to the HOST 600. The HU 500 is a passive unit having no direct influence on a control operation.

The HOST 600 is installed at a side of the semiconductor manufacturing factory. The HOST 600 is connected to the OU 400 through the HU 500 and the general network 900. The HOST 600 stores a plurality of recipes and relationships between lot information and recipes, and based on received lot information and the stored relationship, the HOST 600 selects one of the stored recipes and transmits the selected recipe to the substrate processing apparatus 100.

The CU 700 is an exclusive collection unit installed at a port different from the HU 500 so as to collect data at a high rate. The CU 700 is connected to the OU 400 through the general network 900 and is directly connected to the substrate processing apparatus 100 through the special field network 1000. Data indirectly collected by the OU 400 from a plurality of components of the substrate processing apparatus 100 through the MCs 300A and 300B are stored (accumulated) in the CU 700, and in addition, data directly collected from a plurality of components of the substrate processing apparatus 100 without involving the MCs 300A and the 300B are stored (accumulated) in the CU 700. That is, the CU 700 stores two kinds of data: indirect data collected through the MC 300 (MCs 300A and 300B), and direct data directly collected from a plurality of components of the substrate processing apparatus 100. Like the HU 500, the CU 700 is a unit having no direct influence on a control operation.

The DB 800 is installed at a side of the semiconductor manufacturing factory. Data acquired by the CU 700 are stored in the DB 800 through the general network 900 so that the data can be timely extracted/analyzed at the semiconductor manufacturing factory side.

In one direction, data of the substrate processing apparatus 100 are indirectly collected to the CU 700 through the MC 300 or the OU 400 and the general network 900, and then the data are transmitted and reported to the DB 800 by a program. In the other direction, data of the substrate processing apparatus 100 are directly collected to the CU 700 through the field network, and after being standardized, the data are reported to the DB 800.

In addition, the same data report may be made for the HOST 600.

In addition, since such OU/MC/HU can be configured by software programs, they are not limited by one-to-one correspondence with physical computers that actually operate. For example, various configurations such as a combination of an OU and a HU and a combination of an OU and an MC are possible. For example, a configuration for operation in the same computer may be possible.

In the above-described distributed processing system, for example, a HOST is connected to a substrate processing apparatus. However, in another example, a HOST may be connected to a plurality of substrate processing apparatuses for management of the plurality of substrate processing apparatuses.

(1-2) Structure of Substrate Processing Apparatus

Figure 19:
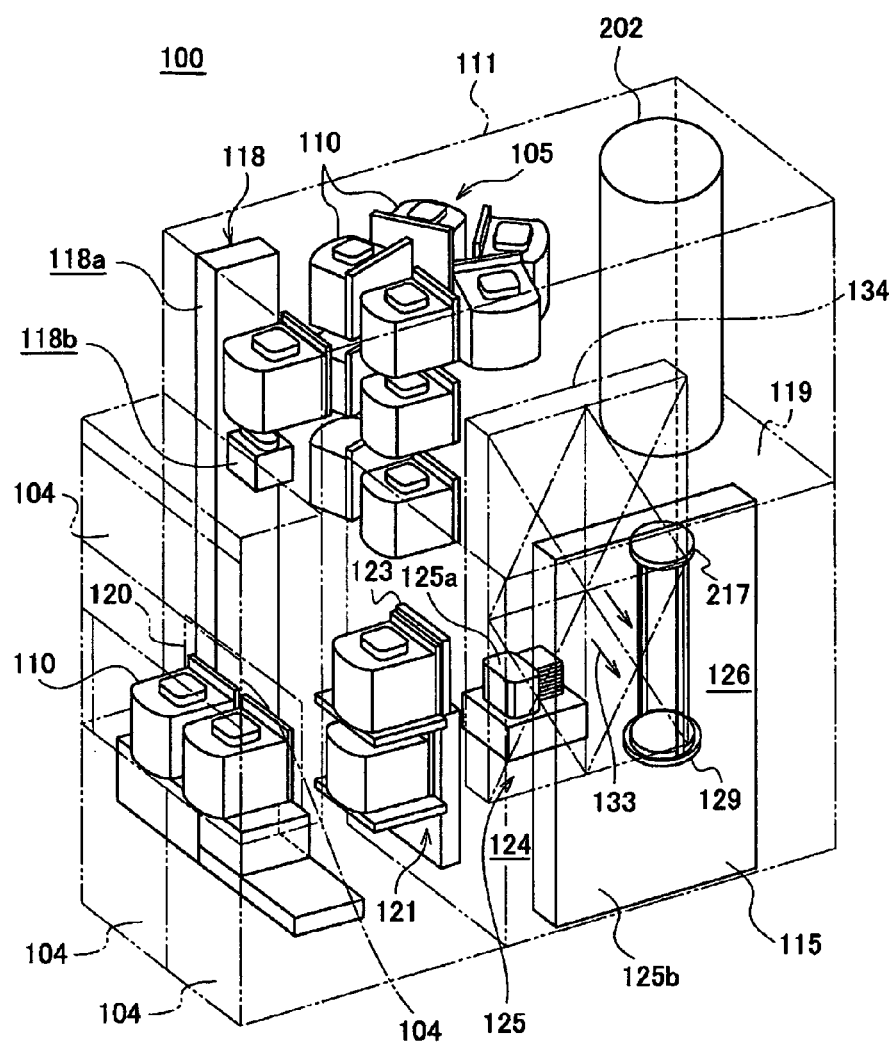
FIG. 19 is a perspective view illustrating a substrate processing apparatus according to the first embodiment of the present invention.
Figure 20:
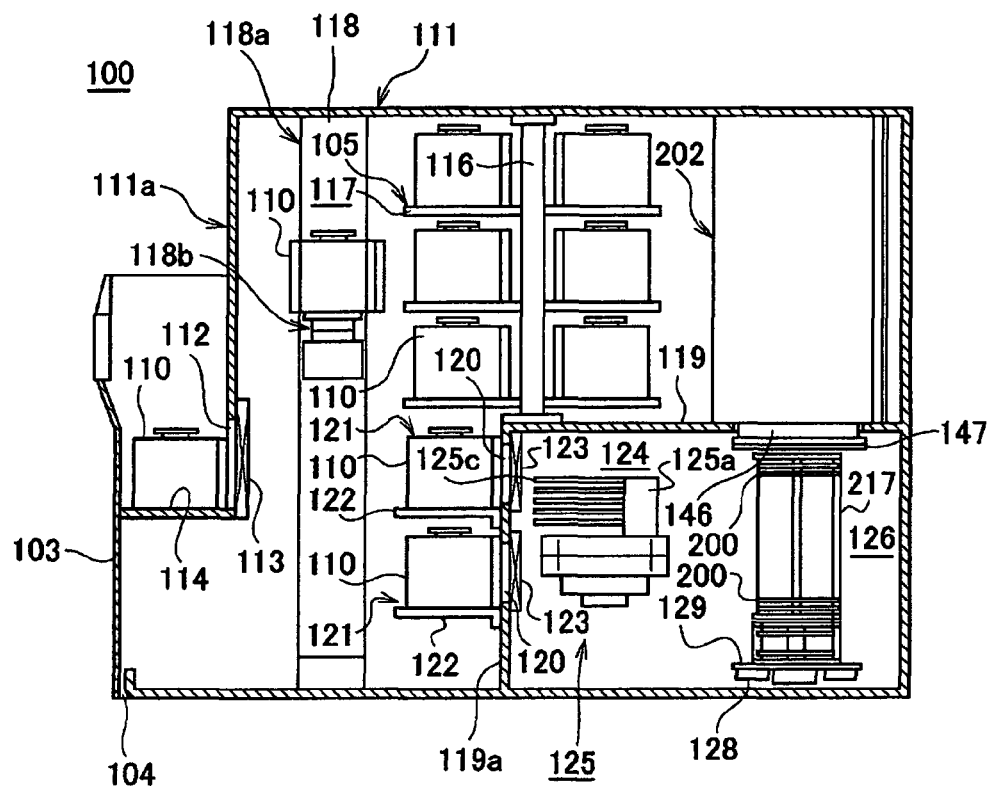
FIG. 20 is a side sectional view illustrating the substrate processing apparatus according to the first embodiment of the present invention.

Next, the structure of the substrate processing apparatus 100 of the current embodiment will be described with reference to FIG. 19 and FIG. 20. FIG. 19 is a perspective view illustrating the substrate processing apparatus according to the current embodiment of the present invention, and FIG. 20 is a side sectional view illustrating the substrate processing apparatus according to the current embodiment of the present invention. The substrate processing apparatus 100 of the current embodiment is configured as a vertical semiconductor manufacturing apparatus configured to perform a process such as oxidation, diffusion, or CVD treatment on a substrate such as a wafer.

As shown in FIG. 19 and FIG. 20, according to the current embodiment, the substrate processing apparatus 100 includes a case 111 as a pressure-resistant vessel. At the front side of a front wall 111a of the case 111, a front maintenance entrance 103 is formed as an opening for maintenance works. At the front maintenance entrance 103, a pair of front maintenance doors 104 is installed for closing and opening the front maintenance entrance 103. Pods (substrate containers) 110 in which wafers (substrates) 200 are accommodated are used as carriers configured to carry wafers 200 into and out of the case 111.

At the front wall 111a of the case 111, a pod carrying entrance (substrate container carrying entrance) 112 is formed to connect the inside and outside of the case 111. The pod carrying entrance 112 is configured to be opened and closed by a front shutter (substrate container carrying entrance opening/closing mechanism) 113. At the front side of the pod carrying entrance 112, a load port (substrate container stage) 114 is installed. The pods 110 are configured to be adjusted in positions when placed on the load port 114. The pods 110 are configured to be carried onto the load port 114 by an in-process carrying device (not shown).

Near the upper center part of the inside of the case 111 in a front-to-back direction, a rotatable pod shelf (substrate container shelf) 105 is installed. A plurality of pods 110 can be stored on the rotatable pod shelf 105. The rotatable pod shelf 105 includes a pillar 116 which is vertically installed and intermittently rotatable on a horizontal plane, and a plurality of shelf plates (substrate container stages) 117 which are radially supported at upper, middle, and lower positions of the pillar 116. The shelf plates 117 are configured so that a plurality of pods 110 can be placed and held on each of the shelf plates 117.

At the inside of the case 111 between the load port 114 and the rotatable pod shelf 105, a pod carrying device (substrate container carrying device) 118 is installed. The pod carrying device 118 includes a pod elevator (substrate container elevating mechanism) 118a capable of moving upward and downward while holding a pod 110, and a pod carrying mechanism (substrate container carrying mechanism) 118b as a carrying mechanism. The pod carrying device 118 is configured such that a pod 110 can be carried among the load port 114, the rotatable pod shelf 105, and pod openers (substrate container cover opening/closing mechanism) 121 by continuous operations of the pod elevator 118a and the pod carrying mechanism 118b.

At the lower inside part of the case 111, a sub case 119 is installed in a manner such that the sub case 119 extends from about the center part to the rear part in a front-to-back direction. In order to carry wafers 200 into and out of the sub case 119, a pair of wafer carrying entrances (substrate carrying entrances) 120 are formed at a front wall 119a of the sub case 119 in a manner such that the wafer carrying entrances 120 are vertically arranged in two stages. At the upper and lower wafer carrying entrances 120, the pod openers 121 are installed, respectively.

Each of the pod openers 121 includes a stage 122 and a cap attachment/detachment mechanism (cover attachment/detachment mechanism) 123 configured to attach and detach a cap (cover) of a pod 110. Each of the pod opener 121 is configured to attach and detach a cap of a pod 110 placed on the stage 122 for closing and opening a wafer entrance of the pod 110.

A transfer chamber 124 is formed in the sub case 119 in a manner such that the transfer chamber 124 is fluidically isolated from a space where parts such as the pod carrying device 118 and the rotatable pod shelf 105 are installed. At the front region of the transfer chamber 124, a wafer transfer mechanism (substrate transfer mechanism) 125 is installed. The wafer transfer mechanism 125 includes a wafer transfer device (substrate transfer device) 125a capable of rotating or straightly moving wafers on a horizontal plane, and a wafer transfer device elevator (substrate transfer device elevator) 125b capable of moving the wafer transfer device 125a upward and downward. As shown in FIG. 19, the wafer transfer device elevator 125b is installed between the right end part of the front region of the transfer chamber 124 of the sub case 119 and the right end part of the case 111. The wafer transfer device 125a includes a tweezers (substrate holder) 125c as a stage for placing wafers 200 thereon. By continuous operations of the wafer transfer device elevator 125b and the wafer transfer device 125a, wafers 200 can be charged into a boat (substrate holding tool) 217 or discharged from the boat 217.

In the rear region of the transfer chamber 124, a standby section 126 is provided so as to accommodate the boat 217 in standby state. At the upper side of the standby section 126, a process furnace 202 is installed as a substrate processing system. The bottom side of the process furnace 202 is configured to be closed/opened by a furnace port shutter (furnace port opening/closing mechanism) 147.

As shown in FIG. 19, between the right end part of the standby section 126 of the sub case 119 and the right end part of the case 111, a boat elevator (substrate holding tool elevating mechanism) 115 is installed to lift and lower the boats 217. A connecting tool such as an arm 128 is connected to an elevator base of the boat elevators 115. A cover such a seal cap 219 is horizontally attached to the arm 128. The seal cap 219 is configured to support the boat 217 vertically and close the bottom side of the process furnace 202.

The boat 217 includes a plurality of holding members. The boat 217 is configured to hold a plurality of wafers 200 (for example, fifty to one hundred twenty five wafers) horizontally in a state where the centers of the wafers 200 are vertically aligned.

As shown in FIG. 19, at the left end part of the transfer chamber 124 opposite to the wafer transfer device elevator 125b and the boat elevator 115, a cleaning unit 134 configured by a supply fan and a dust filter is installed so as to supply cleaned atmosphere or inter gas as clean air 133. Between the wafer transfer device 125a and the cleaning unit 134, a notch alignment device (not shown) is installed as a substrate matching device for aligning the circumferences of wafers.

Clean air 133 blown from the cleaning unit 134 flows around the notch alignment device (not shown), the wafer transfer device 125a, and the boat 217 disposed at the standby section 126. Then, the air 133 is sucked through a duct (not shown) toward the outside of the case 111, or the air 133 is circulated back to a suction side of the cleaning unit 134, that is, a primary side (supply side) of the cleaning unit 134, so as to be blown back to the transfer chamber 124 by the cleaning unit 134.

(1-3) Operation of Substrate Processing Apparatus

Next, an explanation will be given on an operation of the substrate processing apparatus 100 according to the current embodiment with reference to FIG. 19 and FIG. 20.

As shown in FIG. 19 and FIG. 20, when a pod 110 is supplied to the load port 114, the pod carrying entrance 112 is opened by moving the front shutter 113. Then, the pod 110 is carried into the case 111 through the pod carrying entrance 112 by the pod carrying device 118.

The pod 110 carried into the case 111 is automatically carried to the shelf plate 117 of the rotatable pod shelf 105 by the pod carrying device 118 and is temporarily stored on the shelf plate 117, and then the pod 110 is transferred to the stage 122 of one of the pod openers 121. Alternatively, the pod 110 carried into the case 111 may be directly transferred to the stage 122 of the pod opener 121. At this time, the wafer carrying entrance 120 of the pod opener 121 is closed by the cap attachment/detachment mechanism 123, and clean air 133 is circulated and filled in the transfer chamber 124. For example, nitrogen gas is filled in the transfer chamber 124 as clean air 133 so as to keep the oxygen concentration of the inside of the transfer chamber 124, for example, at 20 ppm or lower, which is much lower than the oxygen concentration of the inside of the case 111 kept at ambient atmosphere.

When the pod 110 is placed on the stage 122, the opening-side of the pod 110 is pressed by the edge of the wafer carrying entrance 120 of the front wall 119a of the sub case 119, and along with this, the cap of the pod 110 is detached by the cap attachment/detachment mechanism 123, so that the wafer entrance of the pod 110 can be opened. Thereafter, wafers 200 are picked up from the pod 110 through the wafer entrance of the pod 110 by the tweezers 125c of the wafer transfer device 125a, and after the orientations of the wafers 200 are aligned by the notch alignment device, the wafers 200 are carried to the standby section 126 located at the rear side of the transfer chamber 124 and charged into the boat 217 (wafer charging). After the wafer transfer device 125a charges the wafers 200 into the boat 217, the wafer transfer device 125a returns to the pod 110 for charging the next wafers 200 into the boat 217.

While wafers 200 are charged into the boat 217 from the side of one (upper or lower one) of the pod openers 121 by the wafer transfer mechanism 125, another pod 110 is concurrently carried to and placed on the stage 122 of the other (lower or upper one) of the pod openers 121 from the rotatable pod shelf 105 by the pod carrying device 118, and the other pod opener 121 opens the wafer entrance of the other pod 110.

After a predetermined number of wafers 200 are charged into the boat 217, the bottom side of the process furnace 202 closed by the furnace port shutter 147 is opened by moving the furnace port shutter 147. Then, the boat 217 in which the wafers 200 are held is loaded into the process furnace 202 by lifting the seal cap 219 using the boat elevator 115 (boat loading).

After the loading operation, a predetermined process is performed on the wafers 200 disposed in the process furnace 202. After the process, in approximately the reverse order to the above-described loading order except for the alignment of wafers by the notch alignment device, the boat 217 in which the processed wafers 200 are stored is carried out from the inside of the process furnace 202, and then pods 110 in which the processed wafers 200 are accommodated are carried out of the case 111.

(1-4) Structure of Process Furnace

Next, the process furnace 202 of the current embodiment will be described with reference to FIG. 21.

Figure 21:
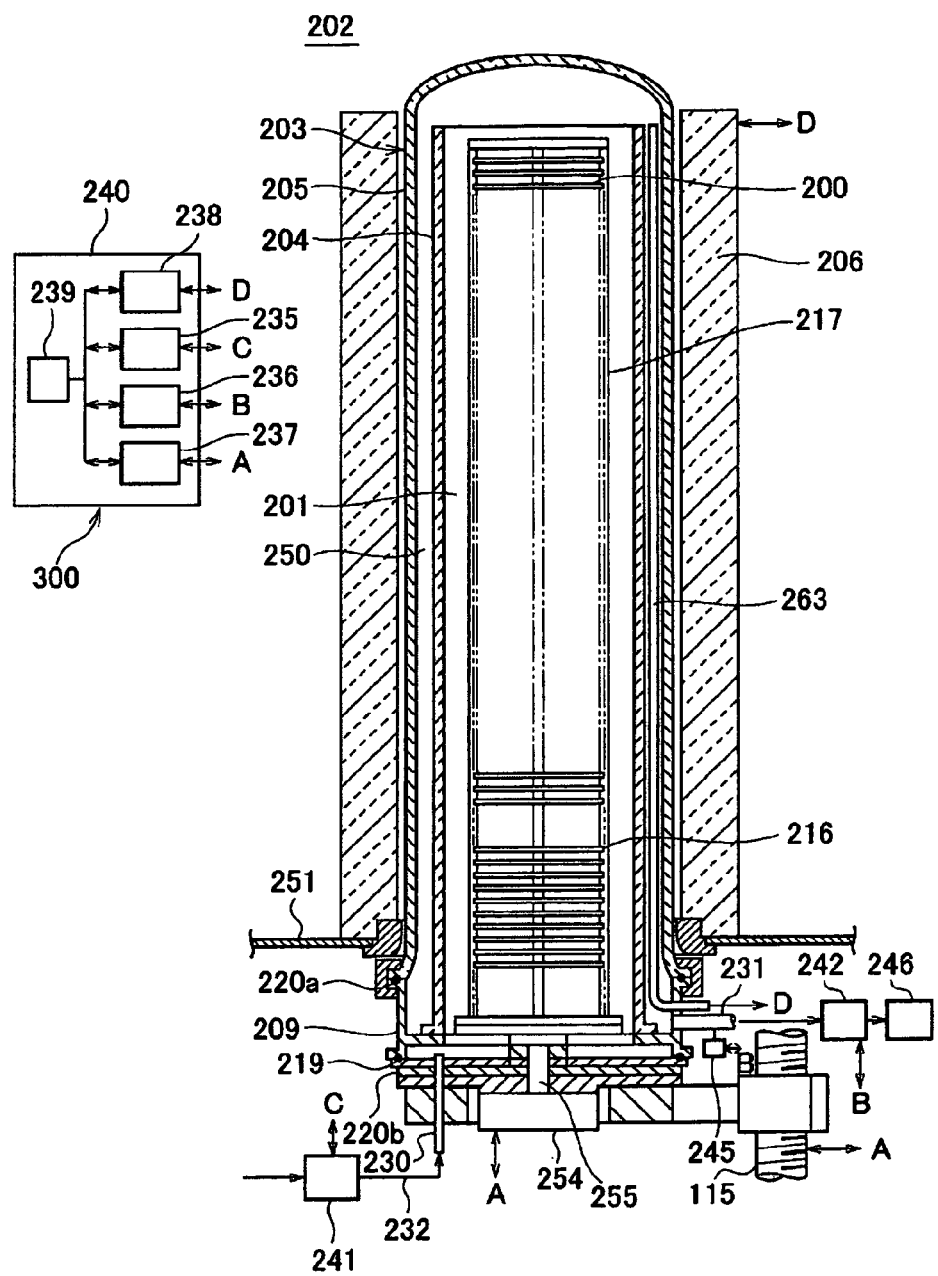
FIG. 21 is a vertical sectional view illustrating a process furnace of the substrate processing apparatus according to the first embodiment of the present invention.
Figure 22:
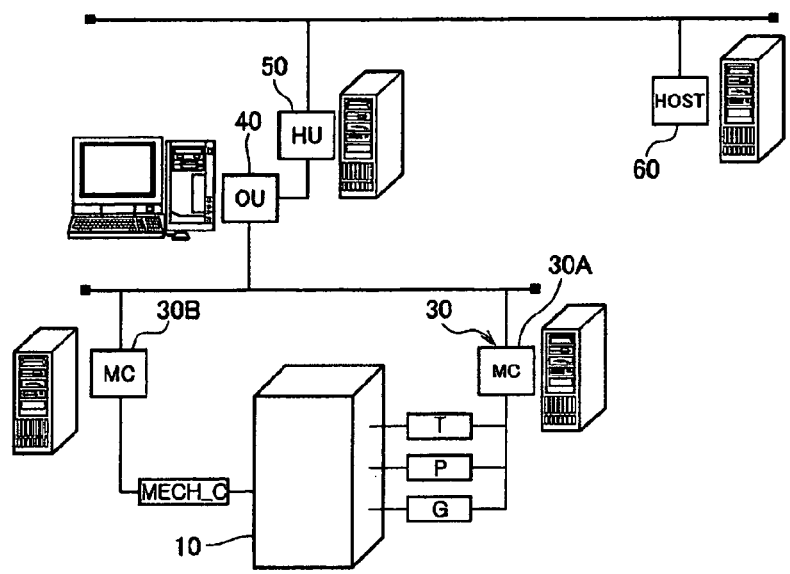
FIG. 22 is a view illustrating a conventional substrate processing system.

FIG. 21 is a vertical sectional view illustrating a process furnace of the substrate processing apparatus according to the current embodiment of the present invention.

As shown in FIG. 21, the process furnace 202 includes a process tube 203 as a reaction tube. The process tube 203 includes an inner tube 204 as an inner reaction tube and an outer tube 205 installed outside the inner tube 204 as an outer reaction tube. The inner tube 204 is made of a heat resistant material such as quartz ($SiO_2$) or silicon carbide (SiC) and has a cylindrical shape with opened top and bottom sides. A process chamber 201 is formed at a hollow part of the inner tube 204 so that substrates such as wafers 200 can be processed in the process chamber 201. The process chamber 201 is configured so that the boat 217 (described later) can be accommodated in the process chamber 201. The outer tube 205 is installed coaxially with the inner tube 204. The outer tube 205 has a cylindrical shape having a closed top side and an opened bottom side, and the inner diameter of the outer tube 205 is larger than the outer diameter of the inner tube 204. The outer tube 205 is made of a heat resistant material such as quartz or silicon carbide.

At the outer side of the process tube 203, a heater 206 is installed as a heating mechanism in a manner such that the heater 206 surrounds the sidewall of the process tube 203. The heater 206 has a cylindrical shape and is vertically installed in a state where the heater 206 is supped by a heater base 251 which is a holding plate.

At the lower side of the outer tube 205, a manifold 209 is installed coaxially with the outer tube 205. The manifold 209 is made of a material such as stainless steel and has a cylindrical shape with opened top and bottom sides. The manifold 209 is engaged with the bottom sides of the inner tube 204 and the outer tube 205 for supporting the inner tube 204 and the outer tube 205. Between the manifold 209 and the outer tube 205, an O-ring 220a is installed as a sealing member. The manifold 209 is supported by the heater base 251 so that the process tube 203 can be vertically installed. The process tube 203 and the manifold 209 constitute a reaction vessel.

A nozzle 230 is connected to a seal cap 219 (described later) in communication with the inside of the process chamber 201 as a gas introduction part. A gas supply pipe 232 is connected to the nozzle 230. To the upstream side of the gas supply pipe 232 (opposite to the nozzle 230), a process gas supply source (not shown) or an inert gas supply source (not shown) is connected, and a mass flow controller (MFC) 241 used as a gas flow control device is disposed between the upstream side of the gas supply pipe 232 and the gas supply source. A gas control part 235 is electrically connected to the MFC 241. The gas control part 235 is configured to control the MFC 241 so that the flowrate of gas supplied to the inside of the process chamber 201 can be adjusted to a desired level at a desired time.

At the manifold 209, an exhaust pipe 231 is installed to exhaust the inside atmosphere of the process chamber 201. The exhaust pipe 231 is disposed at a lower end side of a cylindrical space 250 formed between the inner tube 204 and the outer tube 205 and communicates with the cylindrical space 250. To the downstream side of the exhaust pipe 231 (opposite to the manifold 209), a pressure detector such as a pressure sensor 245, a pressure adjusting device 242 configured by, for example, an auto pressure controller (APC), and a vacuum exhaust device 246 such as a vacuum pump are sequentially connected from the upstream side. A pressure control part 236 is electrically connected to the pressure adjusting device 242 and the pressure sensor 245. The pressure control part 236 is configured to control the pressure adjusting device 242 based on a pressure value detected by the pressure sensor 245 so as to adjust the inside pressure of the process chamber 201 to a desired level at a desired time.

At the lower side of the manifold 209, the seal cap 219 is installed as a furnace port cover for air-tightly closing the opened bottom side of the manifold 209. The seal cap 219 is configured to make contact with the bottom side of the manifold 209 in a vertical direction from the lower side of the manifold 209. The seal cap 219 is made of a metal such as stainless steel and has a disk shape. At the top surface of the seal cap 219, an O-ring 220b is installed as a sealing member to make contact with the bottom side of the manifold 209. At a center side of the seal cap 219 opposite to the process chamber 201, a rotation mechanism 254 is installed. A shaft 255 of the rotation mechanism 254 is inserted through the seal cap 219 to support bottom side of the boat 217.

The rotation mechanism 254 is configured to rotate wafers 200 by rotating the boat 217. The seal cap 219 is configured to be vertically moved by an elevating mechanism such as a boat elevator 115 vertically installed outside the process tube 203. By lifting or lowering the seal cap 219, the boat 217 can be loaded into the process chamber 201 or unloaded from the process chamber 201. A driving control part 237 is electrically connected to the rotation mechanism 254 and the boat elevator 115. The driving control part 237 is configured to control the rotation mechanism 254 and the boat elevator 115 for operating the rotation mechanism 254 and the boat elevator 115 in a desired manner at a desired time.

As described above, the boat 217 which is a substrate holding tool is configured to hold a plurality of wafers 200 in a manner such that the wafers 200 are horizontally positioned and arranged in multiple stages with the centers of the wafers 200 being aligned. The boat 217 is made of a heat resistant material such as quartz or silicon carbide. At the lower side of the boat 217, a plurality of insulating plates 216, which are made of a heat resistant material such as quartz or silicon carbide and have a disk shape, are horizontally disposed in multiple stages as insulating members for preventing heat transfer from the heater 206 to the manifold 209.

Inside the process tube 203, a temperature sensor 263 is installed as a temperature detector. A temperature control part 238 is electrically connected to the heater 206 and the temperature sensor 263. Based on temperature information detected by the temperature sensor 263, the temperature control part 238 is configured to control power supplied to the heater 206 so as to obtain desired temperature distribution in the process chamber 201 at a desired time.

The gas control part 235, the pressure control part 236, the driving control part 237, and the temperature control part 238 are electrically connected to a main control part 239 that controls the overall operation of the substrate processing apparatus. The gas flow part 235, the pressure control part 236, the driving control part 237, the temperature control part 238, and the main control part 239 are configured as the above-described MC 300.

(1-5) Operation of Process Furnace

Next, as an exemplary semiconductor device manufacturing process, a method of forming a thin film on a wafer 200 by a CVD method using the above-described processing furnace 202 will be explained with reference to FIG. 21. In the following explanation, operations of the respective parts of the substrate processing apparatus are controlled by the MC 300.

After a plurality of wafers 200 are charged into the boat 217 (wafer charging), the boat 217 charged with the wafers 200 is lifted and loaded into the process chamber 201 by the boat elevator 115 as shown in FIG. 21. In this state, the bottom side of the manifold 209 is sealed by the seal cap 219 with the O-ring 220b being disposed therebetween.

The inside of the process chamber 201 is evacuated to a desired pressure (vacuum degree) by the vacuum exhaust device 246. At this time, based on a pressure value measured by the pressure sensor 245, the pressure adjusting device 242 (the degree of valve opening of the pressure adjusting device 242) is feedback-controlled. In addition, the process chamber 201 is heated by the heater 206 to a desired temperature. At this time, based on a temperature value detected by the temperature sensor 263, power to the heater 206 is feedback-controlled. Next, the boat 217 and the wafers 200 are rotated by the rotation mechanism 254.

Thereafter, gas supplied from the process gas supply source while the flowrate of the gas is controlled by the MFC 241 is introduced into the process chamber 201 through the gas supply pipe 232 and the nozzle 230. The introduced gas flows upward inside the process chamber 201 and is discharged from the opened top side of the inner tube 204 to the cylindrical space 250 where the gas is exhausted through the exhaust pipe 231. When the gas passes through the process chamber 201, the gas makes contact with the surfaces of the wafers 200 so that thin films can be deposited on the surfaces of the wafers 200 by thermal CVD reaction.

After a preset time, inert gas is supplied from the inert gas supply source to replace the inside atmosphere of the process chamber 201 with the inert gas, and at this time, the pressure inside the process chamber 201 returns to atmospheric pressure.

After that, the seal cap 219 is moved down by the boat elevator 115 to open the bottom side of the manifold 209 and unload the boat 217, in which the processed wafers 200 are held, from the process tube 203 to the outside through the opened bottom side of the manifold 209 (boat unloading). Then, the processed wafers 200 are discharged from the boat 217 and carried into pods 110 (wafer discharging).

(1-6) Structure of MC 300

Next, the MC 300 illustrated in FIG. 1 will be described in detail. The MC 300 includes the MCs 300A and 300B.

Figure 2:
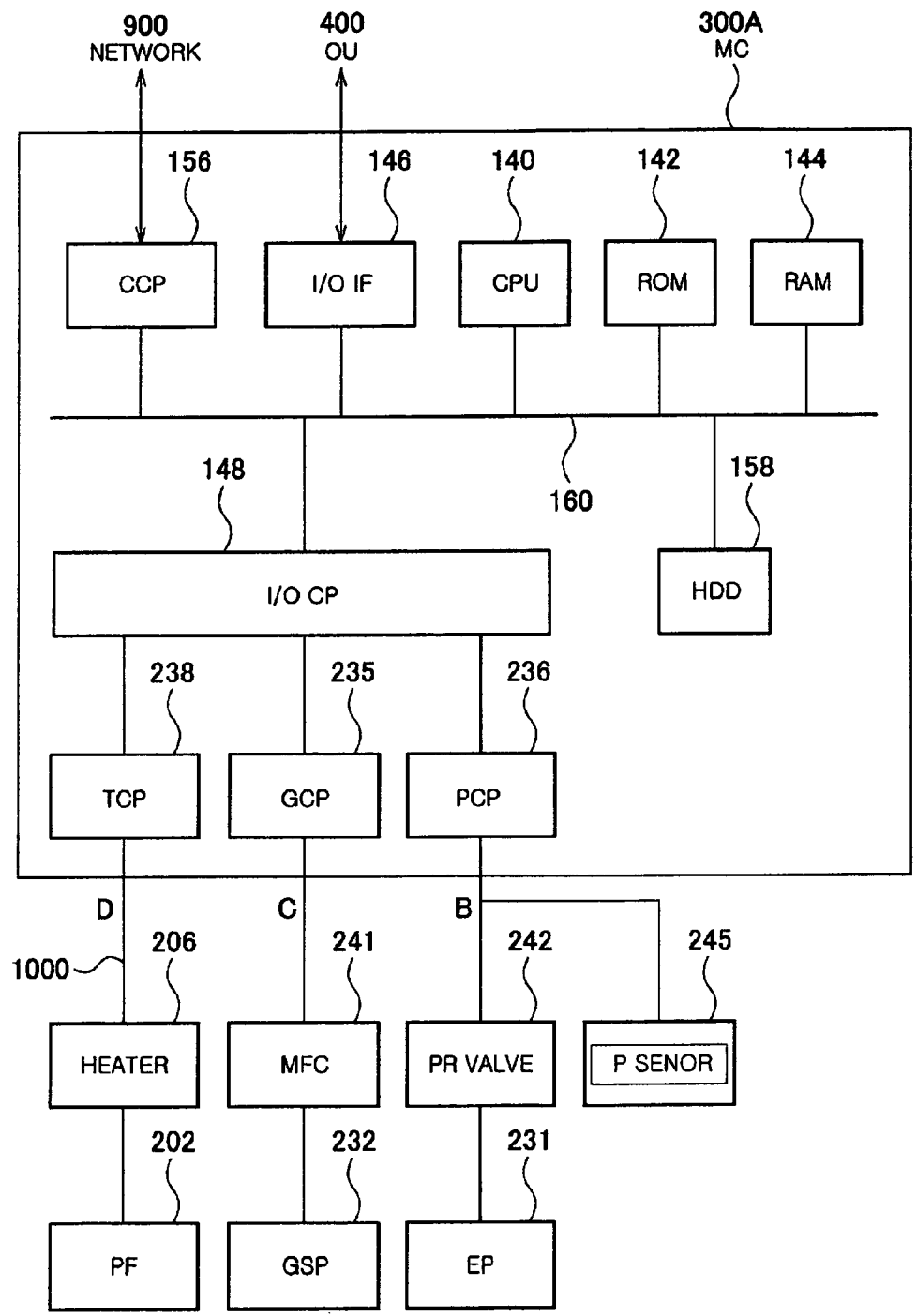
FIG. 2 is a view illustrating a module controller (MC) according to the first embodiment of the present invention.

FIG. 2 illustrates a hardware structure of and around the MC 300A configured to control temperature, gas, and pressure.

The MC 300A includes: a CPU 140; a read-only memory (ROM) 142; a random-access memory (RAM) 144; an input/output interface (I/O IF) 146 provided for data transmission between input and output devices; the temperature control part 238; the gas control part 235; the pressure control part 236; an I/O control part 148 configured to perform an I/O control operation for parts such as the temperature control part 238; a communication control part 156 configured to control data communication with the operation unit (OU) 400 (which is an external computer) through the general network 900; and a hard disk drive (HDD) 158 configured to store data. The constitutional elements of the MC 300A are connected to each other through a bus 160 so that data can be transmitted between the constitutional elements through the bus 160.

In the MC 300A, based on a recipe transmitted from the HOST 600 through the HU 500 or the OU 400, the CPU 140 controls the apparatus so as to process wafers. In detail, the CPU 140 outputs control data (control instruction) to the temperature control part 238, the gas control part 235, and the pressure control part 236. The ROM 142, the RAM 144, and the HDD 158 store programs or data such as a sequence program and data input through the communication control part 156.

The temperature control part 238 adjusts the inside temperature of the process chamber 201 by controlling the heater 206 installed at the outer circumference of the process furnace 202. For example, the gas control part 235 controls the amount of reaction gas supply to the inside of the process chamber 201 based on values output from the MFC (mass flow controller) 241 installed at the gas supply pipe 232 of the process furnace 202. The pressure control part 236 controls the inside pressure of the process chamber 201 by opening or closing the pressure adjusting valve 242 based on values output from the pressure sensor 245 installed at the exhaust pipe 231 of the process furnace 202. In this way, the control parts such as the temperature control part 238 are operated to control the components (such as the heater 206, the MFC 241, and the valve 242) of the substrate processing apparatus 100 based on control instructions output from the CPU 140.

MC 300B

Figure 3:
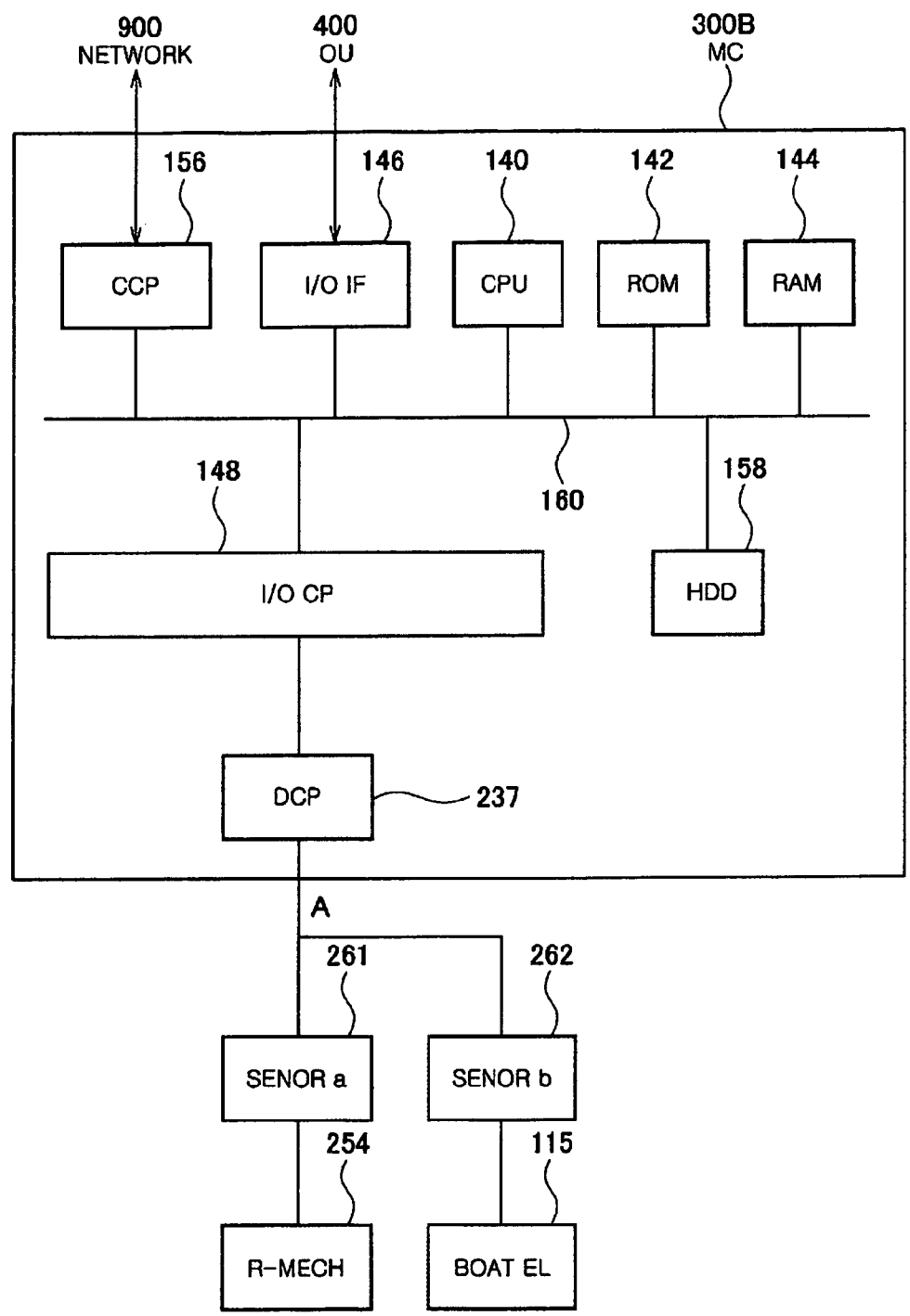
FIG. 3 is a view illustrating a module controller (MC) according to the first embodiment of the present invention.

FIG. 3 illustrates a hardware structure of and around the MC 300B configured to control a driving part. The hardware structure of FIG. 3 is the same as that of FIG. 2 except for a control part and components to be controlled, and thus the same parts are denoted by the same reference numerals and not described again. The driving control part 237 controls rotation and upward/downward movement of the boat 217 by using sensors (a) and (b) installed at the rotation mechanism 254 and the boat elevator 115 of the process furnace 202.

When data of a recipe are transmitted from the HOST 600, the data are input to the MCs 300A and 300B through the communication control part 156. The CPU 140 executes a sequence program to read a command from the received recipe and carry out the command. By this steps in which target values of control parameters are set are sequentially performed, and the control instruction can be transmitted to the temperature control part 238, the gas control part 235, and the driving control part 237 through the I/O control part 148 so as to process substrates. According to the control instruction, the control parts such as the temperature control part 238 are operated to control components (such as the heater 206, the MFC 241, the valve 242, and the rotation mechanism 254) of the substrate processing apparatus 100. In this way, a processing process is performed on wafers 200.

(1-7) Structure of CU 700

Figure 4:
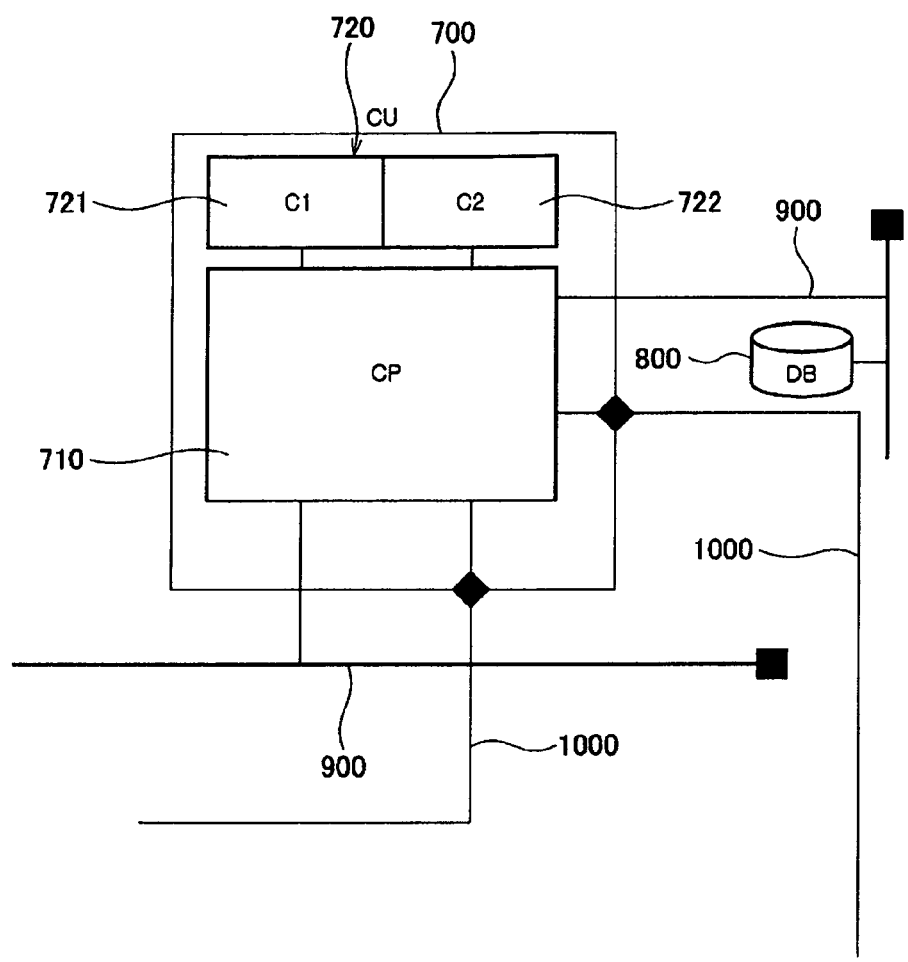
FIG. 4 is a view illustrating a collection unit (CU) according to the first embodiment of the present invention.

FIG. 4 illustrates a hardware structure of and around the CU 700 configured to collect and store (accumulate) data. The CU 700 is configured to automatically collect data (such as temperature, gas flowrate, pressure, and driving control data) from various components of the substrate processing apparatus 100. The CU 700 is configured mainly by a control part 710 and a memory part 720 (including a C1 memory part 721 and a C2 memory part 722). The control part 710 is disposed between the networks 900 and 1000 and the memory part 720, and is configured to write data transmitted through the networks to the memory part 720 or read data from the memory part 720 for transmitting the read data through the networks. The C1 memory part 721 stores data indirectly collected through the MC 300. The C2 memory part 722 stores data directly collected without involving the MC 300. Data transmitted through the general network 900 are automatically collected in the C1 memory part 721 at predetermined control periods. Data transmitted through the field network 1000 are collected in the C2 memory part 722 at control periods shorter than the predetermined control periods.

In addition, the control part 710 is configured to process a request from the DB 800, match C1 data and C2 data, and control transmission to the DB 800; however, the control part 710 does not output a request to the apparatus.

(1-8) Collected Data Report

Here, a first data report method depending on C1 and C2 data sources will be explained.

Like in the substrate processing system illustrated in FIG. 1, data can be directly collected through the separate field network 1000 by using the CU 700 having no direct influence on a control operation, and the collected data can be reported to the HOST 600 or the DB 800 after the data are standardized. In tis case, however, the following problem arises.

A problem of the above-described case is generation of a time difference. That is, a time difference generates because the collect time of C1 data transmitted through the MC 300 or the OU 400 is different from the collect time of directly collected C2 data. Since C1 data collected through the MC 300 or the OU 400 are transmitted to a program via the general network 900, the C1 data may not be real-time but delayed by several hundreds of milliseconds (msec). Therefore, it is difficult to sufficiently match the C1 data with C2 data that are acquired at a high frequency, and thus the semiconductor may include factory side may have difficulty in analyzing the data.

Herein, it is assumed that times of controllers or other devices (such as the MC 300, the OU 400, and the CU 700) of the substrate processing apparatus 100 are synchronized with each other with necessary and sufficient precision.

(1-9) Behavior Causing Time Difference

Figure 7:
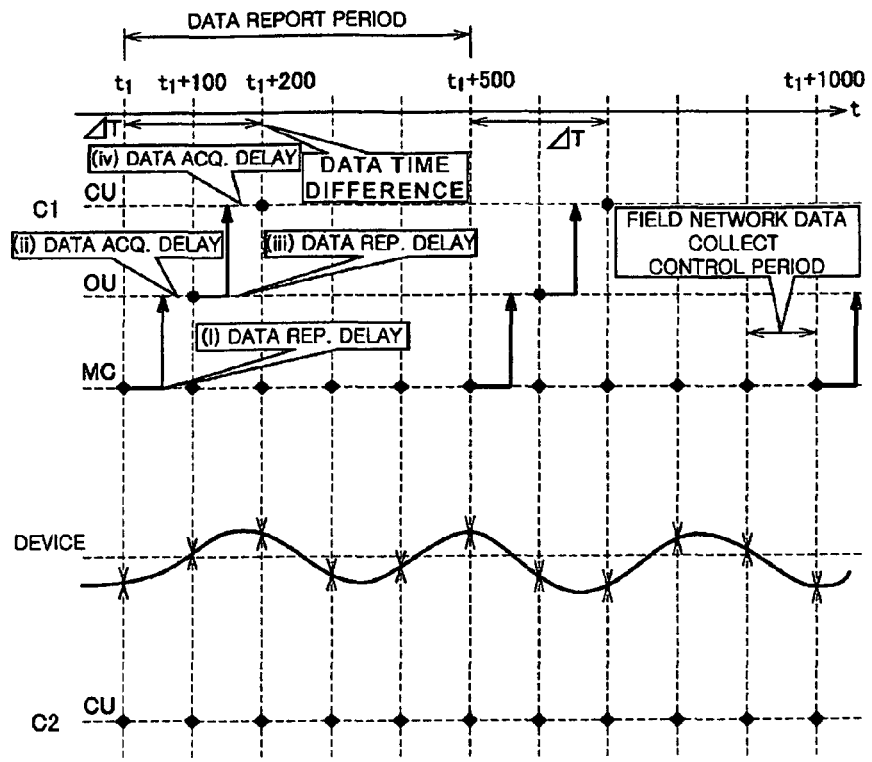
FIG. 7 is a view for explaining data collect timing and delay according to the first embodiment of the present invention.

Time difference will now be described with reference to FIG. 7. FIG. 7 is a timing chart for explaining data collect timing and delay.

(a) Detection and Flow of C1 Data Traveling in MC→OU→CU

In FIG. 7, the horizontal axis is a time axis starting from t1 and marked every 100 msec. The uppermost dashed line denotes CU data which are C1 data indirectly collected through the MC 300 (controller).

The MC 300 acquires component data through the special field network 1000 at field network collection control periods (for example, at periods of 100 msec) (MC♦).

Data report of MC→OU is performed, for example, at a frequency of 1 time/500 msec, so as to maintain a control period. A delay ((i) data report delay) occurs at the MC 300 from the time the MC 300 receives data to the time the MC 300 transmits the data. The data report delay (i) occurs as follows. When the MC 300 acquires data, the MC 300 first performs an internal control operation related to the data, and then the MC 300 transmits the data through a network if it is time to report data to the OU 400 in a report period. Therefore, due to the accumulation of the delay for the internal control operation and the delay from a data buffering time to an actual transmission time, the data report delay (i) is generated.

The OU 400 generates a delay ((ii) data acquisition delay OU●) from the receipt of data to the processing of the data, and a delay ((iii) data report delay) until transmitting the data to the CU 700. The data acquisition delay (ii) is generated as follows. Although the OU 400 input data received through the network 900 to a necessary program, the program can process the data in response to input of the received data only after the program become ready for another task. That is, it is delayed until the received data can be processed. The data report delay (iii) occurs as follows. When the OU 400 transmits data to the CU 700 through a network, due to accumulation of a delay necessary for an internal processing process in the OU 400 and a delay from a time to store data in buffer to an actual transmission time, the data report delay (iii) is generated.

The CU 400 generates a delay ((iv) data acquisition delay) until processing data after receiving the data. The data acquisition delay (iv) is generated due to the same reason as the data acquisition delay (ii).

(b) Detection of C2 Data Via Field Network→CU

In FIG. 7, the lowermost dashed line denotes CU data which are C2 data directly collected without involving the MC 300.

Like the MC 300, the CU 700 acquires component data through the field network 1000 at field network control periods (for example, at periods of 100 msec).

Figure 8:
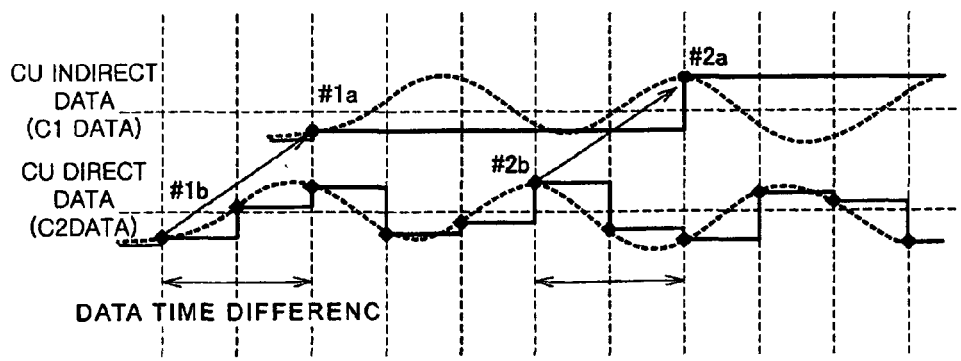
FIG. 8 is a view for explaining a data collect timing displacement according to the first embodiment of the present invention.

Based on the above-described explanation, difference of data collect timing can be denoted by (a) and (b) as shown in FIG. 8. In FIG. 8, lower CU direct data are C2 data, and upper CU indirect data are C1 data. Data time difference between the C1 data and the C2 data is 200 msec, for example. In addition, as compared with the C1 data acquired at periods of 500 msec, the C2 data acquired at periods of 100 msec are more high-precision/high-frequency data.

Until now, it is explained that although required to be stable, the data acquisition at the CU 700 can be varied according to data acquisition routes, for example, with a delay of about 200 msec. The amount of such delay may be varied according to system structures or timing of each controller.

That is, high-precision C2 data required by the HOST 600 or the DB 800 are not timely matched with other data such as C1 data. Particularly, since events (such as carrier loading/unloading and starting/stopping of RUN) or exceptions (such as abnormal temperature and pressure) are managed by the MC 300, data about such events or exceptions are transmitted as C1 data. Therefore, as shown in FIG. 8, at the time when such C1 data (#1*a*, #2*b*) are generated, high-precision C2 data (#1*b*, #2*b*) corresponding to the C1 data are already of the past.

Therefore, although past C1 data are acquired from C2 data, the HOST 600 or the DB 800 cannot determine the existence or degree of a time difference. Accordingly, since the difference between occurrence times of C1 data and C2 data cannot be determined, it is difficult to properly analyze data accumulated in the HOST 600 or the DB 800.

(1-10) Data Report in the Current Embodiment

Figure 23:
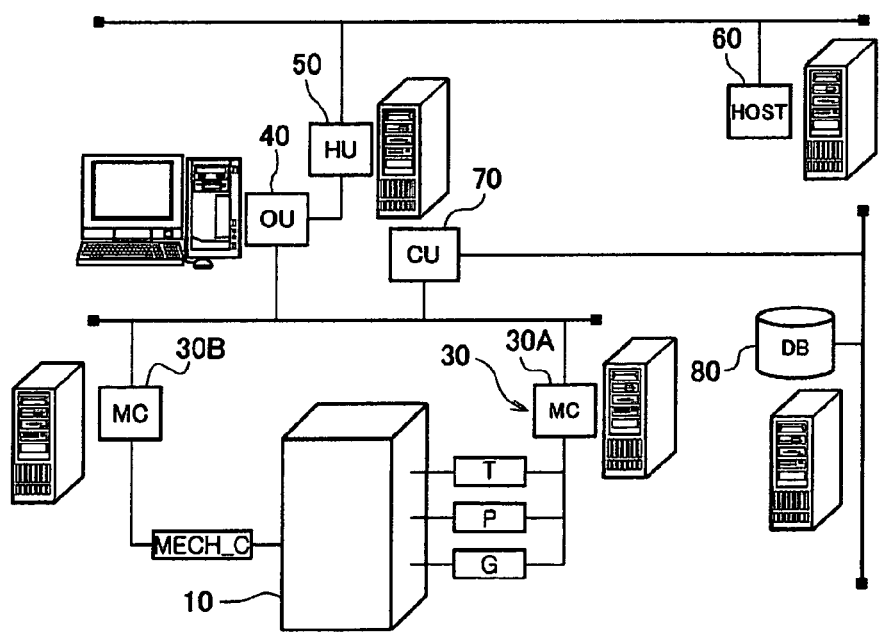
FIG. 23 is a view illustrating a conventional substrate processing system.

The CU 700 or HU 500 of FIG. 1, or the HU 50 of FIG. 23 is configured to report collected data in regulated format at predetermined periods set by the HOST (60, 600) or the DB (80, 800) or an operator.

Basically, in the case of C1 data, the newest data are reported in accordance with the time of CU 700 or the HU 500 (however, there is a delay until the data arrives at the CU 700 or the HU 500).

However, in the case of C2 data, since the C2 data are required to be matched with C1 data, it is necessary to store (accumulate) the C2 data previously and transmit the C2 data that are found to be matched with C1 data to be transmitted. That is, it is necessary to select a proper one of data from stored past C2 data.

Therefore, in the flowing description, a proper one of data is selected from stored past C2 data and is reported.

(1-11) Method of Storing C1 Data

Figures 9, 10:
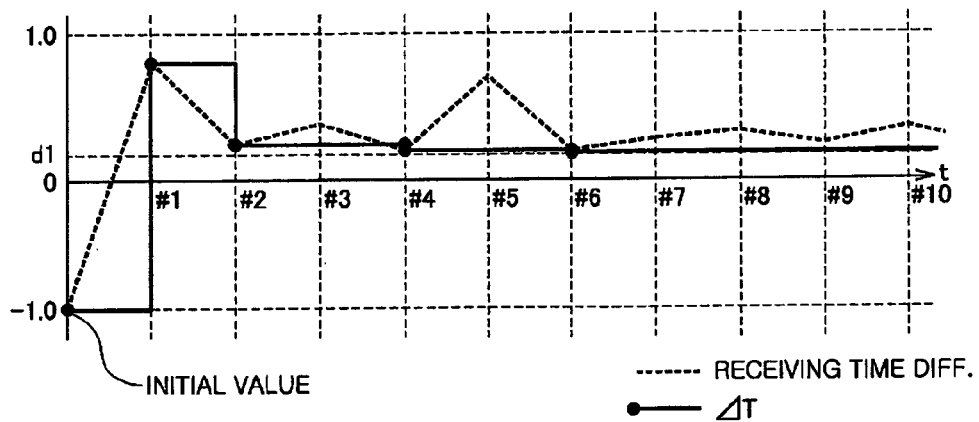
FIG. 9 is a view illustrating a stored data table according to the first embodiment of the present invention.
FIG. 10 is a view for explaining convergence of a Δt parameter according to the first embodiment of the present invention.

In the case of C1 data, one data or less of the latest data is stored in the C1 memory part 721 of the CU 700 for each component. That is, if new data are received, old data are dumped. FIG. 9 illustrates an exemplary stored data table in which C1 data are recorded for each item (area).

For each parameter name ('#' denotes parameter number), an original collect time (actual collect time) at a component such as the MC 300, and a received time at the CU 700 (CU receiving time) are recorded. In addition, the difference between the actual collect time and the CU receiving time is calculated each time data are received, and if the difference is smaller than the previous difference, a parameter value is updated.

In C2 area of the stored data table, 'False' means that that is no C2 data, and 'True' means that there are C2 data.

In general, $\Delta T$ parameter is a naturally converging value. This converging behavior will now be described with reference to FIG. 10.

It is necessary to set the initial value of the difference ($\Delta T$) to a value corresponding to the maximum delay time of the system or a value that does not exist actually. For example, the initial value is set to "−1.0" (−1 second) so that the difference ($\Delta T$) of first receiving data (#1) is not smaller than the initial value. The reason for this is to record the first receiving data (#1) without updating the first receiving data (#1).

The difference ($\Delta T$) between an actual collect time and a CU receiving time of the first receiving data (#1) is recorded (it is surely recorded because the initial value of the difference is set to "−1.0"). Since the difference ($\Delta T$) between an actual collect time and a CU receiving time of second receiving data (#2) is smaller than the current difference ($\Delta T$), it is updated. The difference ($\Delta T$) between an actual collect time and a CU receiving time of third receiving data (#3) is greater than the current difference ($\Delta T$), it is not updated. The difference ($\Delta T$) between an actual collect time and a CU receiving time of fourth receiving data (#4) is smaller than the current difference ($\Delta T$), it is updated.

In this way, values are updated in response to a time difference $\Delta T$ smaller than the current $\Delta T$. Therefore, the $\Delta T$ converges to a minimum value d1 of the difference between the actual collect time and the CU receiving time. A parameter value corresponding to a difference ($\Delta T$) determined in this way is stored for each parameter as shown in FIG. 9.

In addition, generally, C1 data may be collected according to the kinds of collection sources, and times may also be added according to the kinds of collection sources. In this case, $\Delta T$ may also be stored according to the kinds of collection sources so as to reduce calculation load.

(1-12) Method of Storing C2 Data

In the case of C2 data, it is necessary to store (accumulates) n pieces of past data as well as newest data in the C2 memory part 722 of the CU 700 so as to ensure data matching. Therefore, a storing method using a parameter list is suitable. However, n pieces of data occupy the capacity of the C2 memory part 722. Therefore, unnecessarily large data are not preferable; however, this cannot be determined in the same manner due to factors such as a collection period of the MC 300.

Thus, a value may be used, which is obtained by dividing a maximum delay time assumed to be the difference between an actual collect time at a device such as the MC 300 and a CU receiving time by a minimum collect period time at a device such as the MC 300. For example, if it is assumed that the maximum delay time is 1 second, a required storing number is "10," which can be obtained by dividing 1 second by 100 msec.

(maximum delay time)/(minimum collection period time)=
1 sec/100 msec=10

Here, the storing number (n=10) of C2 data is a maximum number.

(1-13) Storing of List

Figures 11, 12:
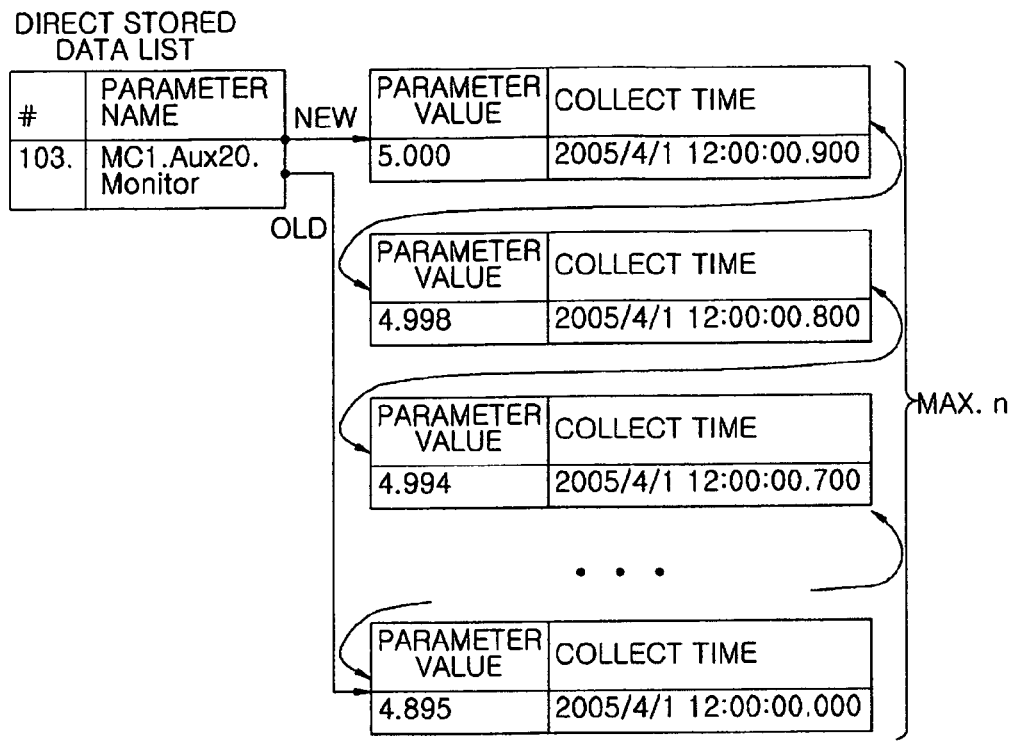
FIG. 11 is a view illustrating a direct stored data list according to the first embodiment of the present invention.
FIG. 12 is a view illustrating a parameter list to be reported according to the first embodiment of the present invention.

Hereinafter, with reference to a direct stored data list shown in FIG. 11, an explanation will be given on a list storing method for storing C2 data in the C2 memory part 722 according to list management.

List management is for storing data or data sets while relating the data or data sets with original data or data sets. In the example shown in FIG. 11, #103 parameter, MC1.Aux20.Monitor, is related with the newest data value (parameter value) of 5.000 (collect time: 2005/4/1 12:00:00.900), and the previous data value of 4.998 (collect time: 2005/4/1 12:00:00.800) is also stored together with the newest data value. By this sequential storing, data having a desired collect time can be searched for from n pieces of data. The exemplary illustrated list structure is for searching for the oldest data from parameter data.

According to the list management method, data can be searched in a reverse order, and unnecessary data can be deleted by changing link information. In addition, a newly collected parameter value is inserted as the newest parameter value to a first place together with its time, and a part of data overflowing the maximum number "n" is excluded and removed from the list.

Furthermore, during parameter searching, if a neighboring parameter having a time equal to or newer than a target time, that is, the time of corresponding C1 data, is found, since the parameter is not referred for the next related parameter values, the parameter is also excluded and deleted from the list. As well as matching with C1 data, sequential processing of all data including events or exceptions can be ensured.

In addition, after collection is started, at least one of data can be related with the direct stored data list except for the first data collect time. Furthermore, after not a long time from the start of program execution, although a parameter value can be related with the direct stored data list, the parameter value may be the same as a target time or the previous data may not be found. In this case, it is determined that there are no data, and the CU 700 does not make a report to the HOST 600 or the DB 800. This situation may occur when a parameter report which was being transmitted before the previous termination of program execution is transmitted again upon the re-execution of the program.

(1-14) Preparation of Report Data

Figure 5:
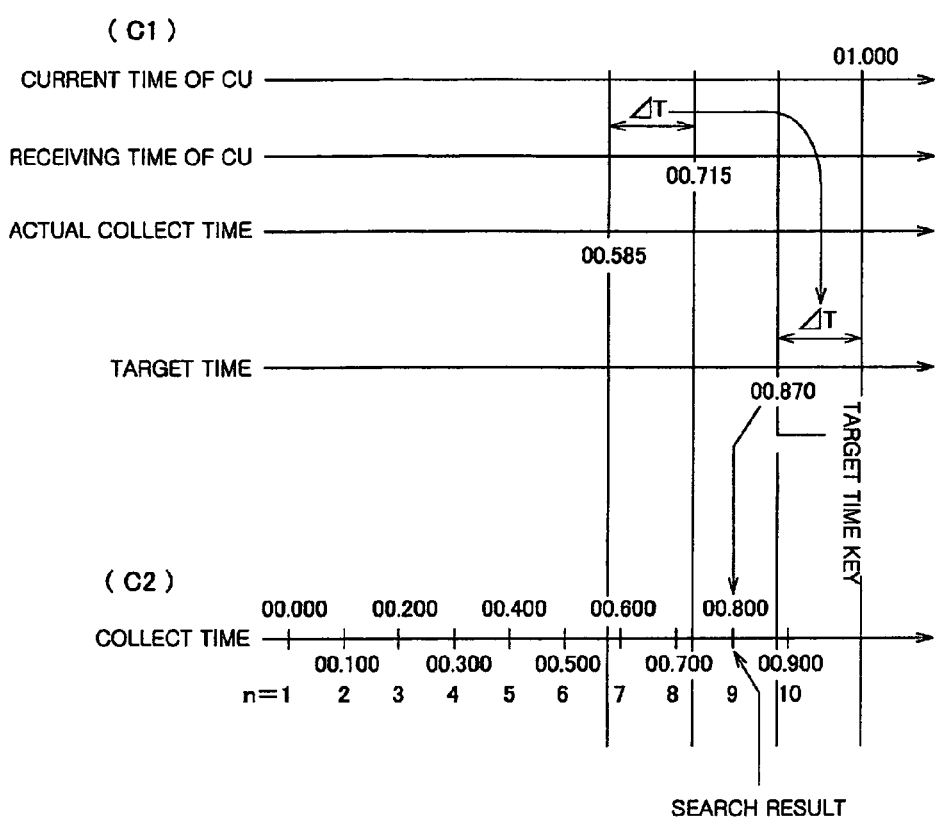
FIG. 5 is a view for explaining C2 data search according to the first embodiment of the present invention.
Figure 6:
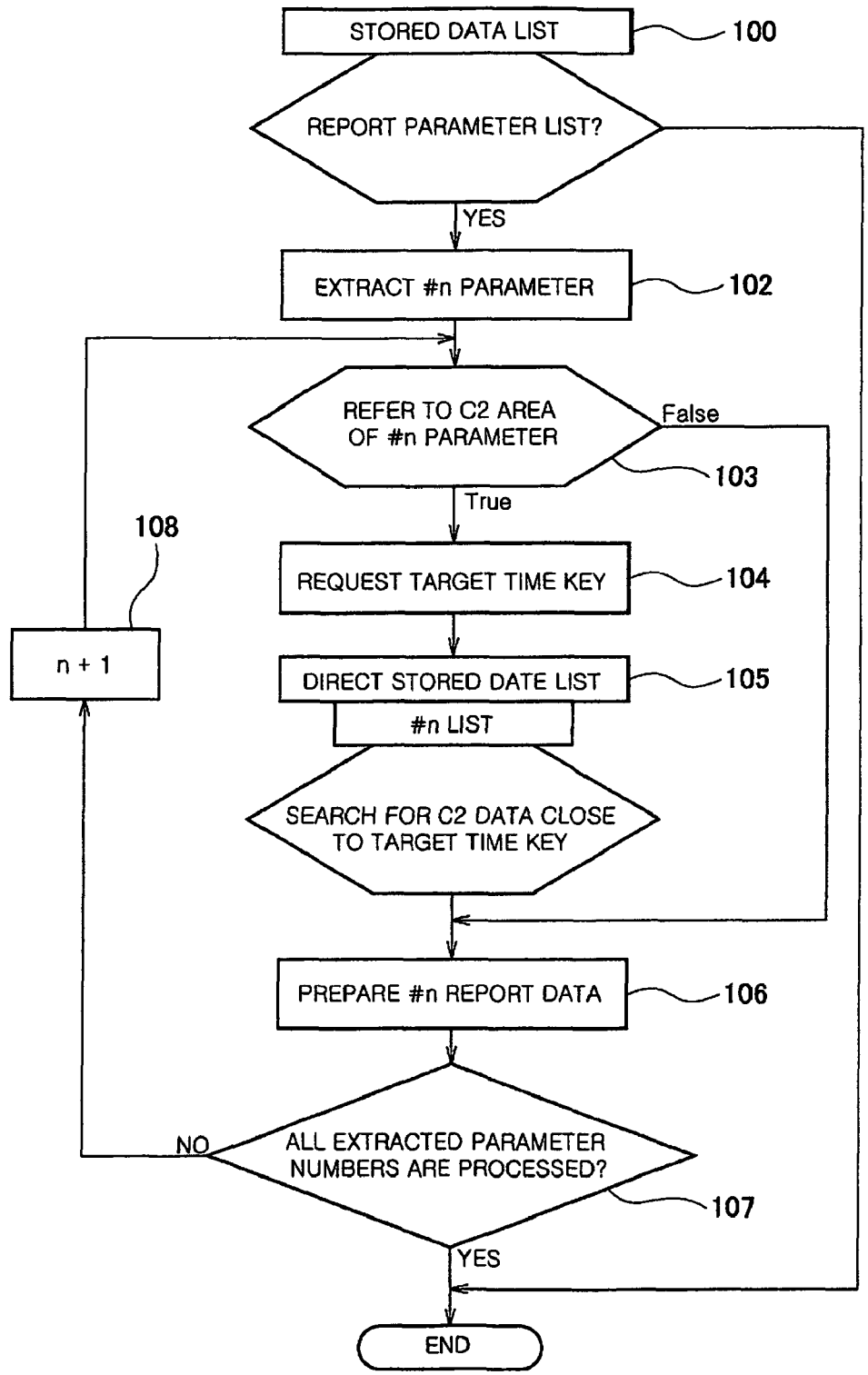
FIG. 6 is a flowchart for explaining report data preparation according to the first embodiment of the present invention.

Preparation of report data is the point of the current embodiment. To prepare report data, it is necessary to search C2 data by setting time as a key. Hereinafter, a process for this will be explained with reference to FIG. 5, FIG. 6, and FIG. 12 to FIG. 18. FIG. 5 is a view for explaining search from C2 data, FIG. 6 is a flowchart for preparing report data, and FIG. 12 to FIG. 18 illustrate report data preparation examples. In the process described below, the OU 400 communicates with the CU 700 through the general network 900.

1) There is a List of Parameter Names to be Reported.

Referring to FIG. 6, it is determined whether a list of parameter names to be reported is in a C1 data stored data table of the C1 memory part 721 (step 100). If there exists no parameter name list, the process is terminated, and if there exists a parameter name list, parameter numbers (#n) are extracted from the list (step 102). FIG. 12 illustrates an example of a parameter name list. In the parameter name list example, n is "1" and "103."

For the purpose of memory management, at least parameter names (#) are required, and the parameter names can be acquired from the stored data table or an additional parameter list.

2) #1 EquipmentStatus

Among the parameter numbers extracted in step 102, an earlier parameter number of the stored data table is called, and it is determined whether it is "False" or "True" with reference to the C2 area. If it is False, data (C2 data) directly collected by the CU 700 does not exist in the C2 memory part 722. Thus, #n data to be reported are only those contained in the table. In this case, the process goes to a #n report data preparation step (step 106) so as to prepare #n report data (step 106).

FIG. 13 illustrates an example of a stored data table. Like the stored data table example, if #1 C2 area is False, #1 report data are only those contained in the stored data table, and the #1 report data are as shown in a report work table of FIG. 14.

3) #103 MC1.Aux20.Monitor

If #n C2 area is True in step 103, it means that there are data (C2 data) directly collected by the CU 700, and thus searching is necessary. The value of #n ΔT is acquired, and a target time value (time key) calculable by subtracting the ΔT from CU current time is requested (step 104).

FIG. 15 illustrates an example of a stored data table. Like the stored data table example, if #103 C2 area is True, CU current time: "2005/4/1 12:00:01.000," and ΔT=0.130, a time key is calculated as follows.

CU current time: "2005/4/1 12:00:01.000"–
0.130="2005/4/1 12:00:00.870"

4) #103 MC1.Aux20.Monitor data search

Upon the request of the target time key in step 104, collect time of C2 data is set as a time key to sequentially search n pieces of C2 data stored (accumulated) in the C2 memory part 722 for #n of the direct stored data list, so as to start to extract list data of which the collect time is "equal to" the time key or "older and closest to" the time key (step 105).

Figures 16, 17:
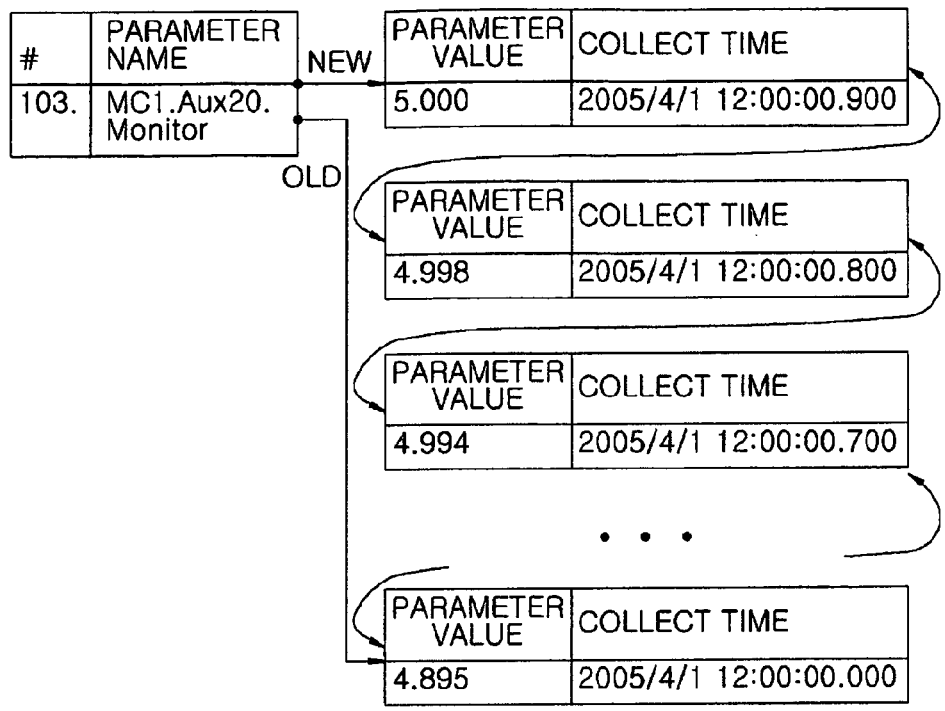
FIG. 16 is a view for explaining #103 MC1.Aux20.Monitor data search according to the first embodiment of the present invention.
FIG. 17 is a view illustrating a report data work table according to the first embodiment of the present invention.

FIG. 16 illustrates an example of a direct stored data list containing #103 MC1.Aux20.Monitor. In the #3 MCLAux20.Monitor list example, pieces of data are sequentially searched for finding a piece of data which is "equal to" or "older and closest to" a target time "2005/4/1 12:00:00.870."

FIG. 5 is a timing chart for explaining a method of searching #103 MC1.Aux20.Monitor data. In the timing chart, only lower time information "00.000" is denoted without the upper time information "2005/4/1 12:00." Since C1 data has ΔT=00.130, if ΔT is subtracted from UC collect time: 01.000, a target time key can be calculated as "00.870." There are ten pieces of C2 data at intervals of "00.1000," and if one of the ten pieces of C2 data which is "equal to" or "older and closest to" the time key is searched for, the result is 00.800.

(1-15) Report Data Work Table

After the searching in step 105, the process goes to the #n report data preparation step (step 106) so as to prepare #n report data (step 106). After report data of the report work table are prepared, it is determined whether the processing is completed for all extracted parameter numbers (step 107), and if the processing is not completed, the next parameter number is called and the procedure returns to step 103 (step 108). In this way, the sequential processing is completed.

FIG. 17 illustrates a report work table of #1 and #3 parameters.

In the case where necessary collection data are not obtained such as a time immediately after the start of an operation, data such as a negative value, "0", or NULL," are set as a parameter value so as to represent the state where no data are collected.

Figure 18:
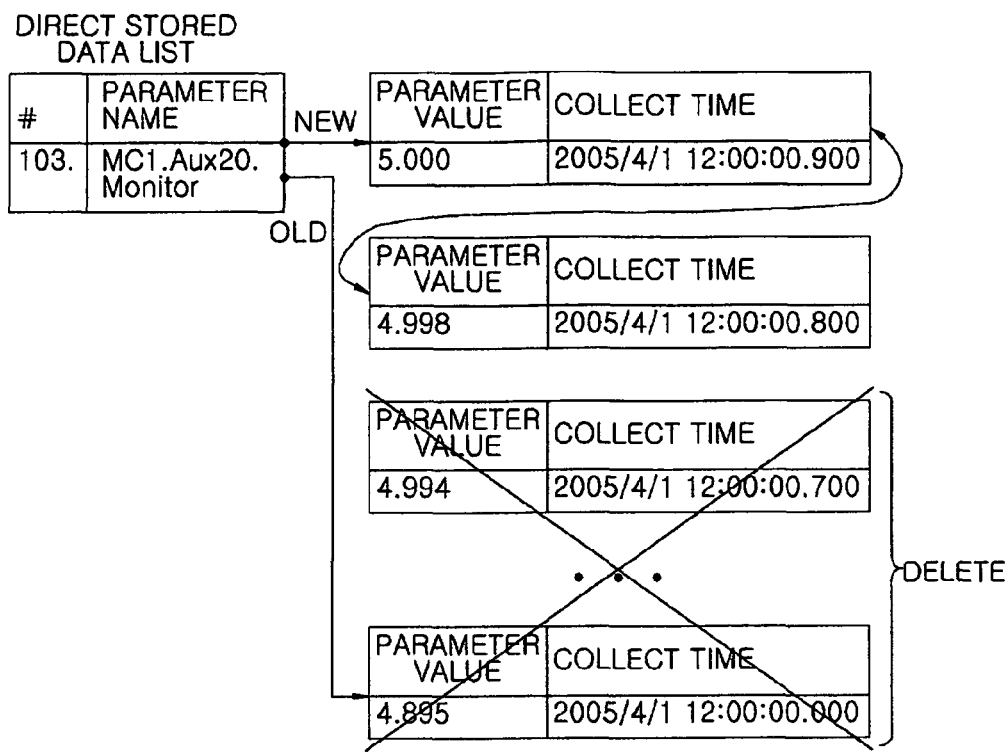
FIG. 18 is a view for explaining deletion of data older than data found in a list according to the first embodiment of the present invention.

In addition, as shown in FIG. 18, since data older than those found in the direct stored data list are not necessary at this time, the data are deleted from the direct stored data list. However, the found data themselves may not be removed since they may be necessary for a future data, event, or exception report.

As described above, since unnecessary data are deleted from the stored data table list, when C2 data are first searched in the next search step, the possibility of the first searching desired data of C2 data is increased. This merit is more notable particularly when data reporting is frequently performed, and thus more effective when the processing load is high.

(1-16) Transmission to HOST or DB

After data necessary for a report are collected as described above, a transmission cue can be input to the control part 710 of the CU 700 for transmission from the CU 700 to the HOST 600 through the OU 400 and HU 500, or transmission from the CU 700 to the DB 800 through the general network 900.

(1-17) Effects of Embodiment

According to the current embodiment, while dealing with a delay (wobble) by using a parameter of ΔT which is a converging value, necessary data can be stably sent to a place such as a HOST installed at a semiconductor manufacturing factory side without using a data transmission route.

In addition, according to the current embodiment, a semiconductor manufacturing apparatus system can provide proper data to a semiconductor manufacturing factory side so that appropriate data analysis is possible at the semiconductor manufacturing factory side.

In addition, according to the current embodiment, C2 data are high-precision and high-frequency data as compared with C1 data, and the C2 data can be matched with other data including the C1 data in terms of timing, so that matched data can be sent to the HOST 600 or the DB 800.

In addition, according to the current embodiment, since the CU accumulates data collected directly from components, the CU can select C2 data matched with C1 data collected through the MC so that high-precision C2 data close to the current time can be transmitted with C1 data timing.

In addition, according to the current embodiment, data obtained by dividing a maximum delay time, which is assumed to be the difference between a collect time at the MC and a CU receiving time, by a minimum collection period time at the MC are previously accumulated, so that proper C2 data can be selected from accumulated C2 data by matching the accumulated C2 data with C1 data so as to transmit the selected C2 data to the HOST or the DB.

In addition, according to the current embodiment, it is assumed that ΔT between the receiving time of C1 data and the current time is the same, and a target time key is requested by subtracting the ΔT from the current time. As described above, C1 data is variably delayed. Therefore, report data prepared by requesting a target time key on the assumption that the ΔT is the same may not always be high-precision data. However, this is inevitable for a distributed system although there is a variation.

In addition, if C2 data corresponding to C1 data cannot be collected because the C1 data are staggered, the C2 data may be omitted from a report; however, high-frequency data continuity is more important for C2 data.

In addition, according to the current embodiment, it is unnecessary to dispose a client system such as a HOST or DB at the same floor (clean room) as the substrate processing apparatus. For example, it is allowable that such a client system is disposed at an office connected via a LAN.

In addition, according to the current embodiment, an exemplary structure of a substrate processing system is described, in which a collection unit can directly collect field network data. However, the present invention can be applied to any other system as long as the system includes a terminal device configured to collect data through a controller and a collection unit configured to collect data directly without involving a controller. Next, a second embodiment of the present invention will be described.

Second Embodiment

In the above-described first embodiment, a first data report method dependent on C1 and C2 data sources is explained so as to provide a way of managing the occurrence order and matching of various data generated in the substrate processing system. For a substrate processing system of the second embodiment, a second data report method independent of C1 and C2 data sources will now be explained. The substrate processing system of the second embodiment has basically the same structure as the substrate processing system of the first embodiment, and thus description thereof will not be repeated.

Overview of Second Embodiment

According to the current embodiment, a collection unit is provided, which collects data generated from a plurality of components with or without involving various controllers. The collection unit is configured to match various collected data, store the matched data temporarily in a buffer, and arrange the data stored in the buffer according to the order of time data included in the stored data. By matching various data and arranging the data according to the order of time data as described above, the occurrence order or matching of the various data can be managed.

Hereinafter, the second embodiment will be described in detail.

(2-1) Second Data Report Method

According to the method independent of data sources, the CU 700 receives data, and the data are temporarily stored in a buffer (temporary storage). Since collect time (time data) is certainly included in the data, the collect time is used when the data are collected.

(2-2) Software Configuration of CU

Figure 24:
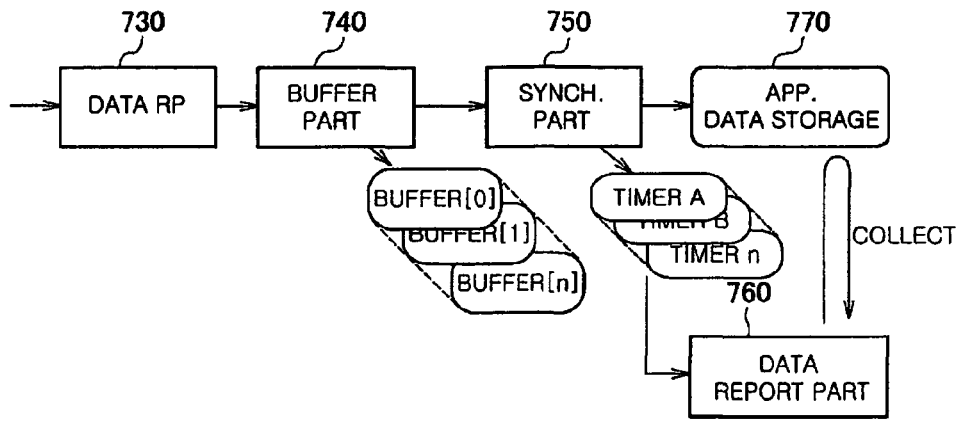
FIG. 24 is a view for explaining software of a CU according to a second embodiment of the present invention.

FIG. 24 is a view illustrating functional parts of a control program (software) executable by a control device such as the control part 710 of the CU 700 of the substrate processing system according to the second embodiment of the present invention. As shown in FIG. 24, the control program includes a data receiving part 730, a buffer part 740, a synchronizing part 750, and a data report part 760. The buffer part 740 may include a plurality of buffers such as buffer [0], buffer [1], . . . , and buffer [n]. The synchronizing part 750 includes a plurality of timers such as timer (A), timer (B), . . . , and timer (n). An apparatus data storage 770 is hardware configured by a memory of the CU 700. Hereinafter, processing processes of the functional parts will be described.

(2-3) Data Receiving Part

The data receiving part 730 denotes a data receiving part of the MC 300, the OU 400, or the CU 700. If necessary, the data receiving part 730 standardizes time data and transfers the time data to the buffer part 740. Herein, standardizing of time data is to match indirect C1 data with direct C2 data. For example, generally, indirect data (C1 data) collected through the MC 300 are standardized in common format including time data. However, generally, direct data (C2 data) are not standardized in common format, and thus the direct data does not have time data. Therefore, standardization is performed in a way of adjusting the format of direct data (C2 data) in accordance with that of indirect data (C1 data) and adding time data to the direct data (C2 data).

Figure 25:
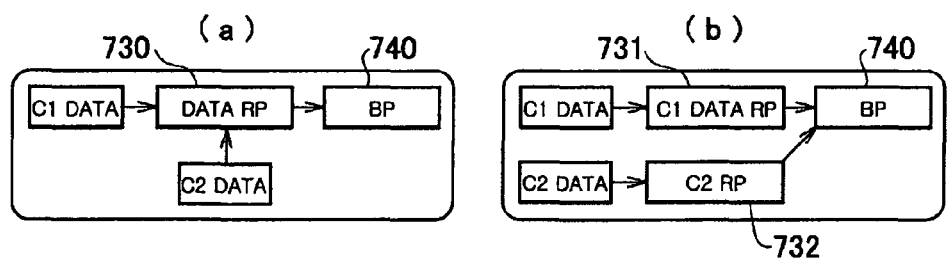
FIG. 25 is a view illustrating a data receiving part according to the second embodiment of the present invention.

The data receiving part 730 collects both C1 data and C2 data. The following collecting methods may be used. As shown in FIG. 25(*a*), C1 data and C2 data may be commonly collected by the single data receiving part 730 and sent to the buffer part 740. Alternatively, as shown in FIG. 25(*b*), C1 data and C2 data may be separately treated by two data receiving parts: a C1 data receiving part 731 and a C2 data receiving part 732, and then the collected C1 data and C2 data may be commonly sent to the buffer part 740. In FIG. 25, the case of collecting C1 data and C2 data is illustrated. However, the present invention is not limited thereto. For example, only C1 data or C2 data may be collected.

(2-4) Buffer Part

Figure 26:
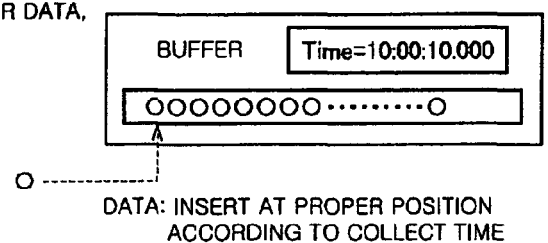
FIG. 26 is a view for explaining data insertion to a buffer according to the second embodiment of the present invention.

The buffer part 740 temporarily stores standardized data. Data such as apparatus monitor data, events, exception notices, and empty data generated by an internal timer (described later) are sent to the buffer part 740. Furthermore, in the current embodiment, as shown in FIG. 26, data are inserted to a proper position in accordance with collecting time order.

In addition, if receipt data are not input, so as to properly process data staying in the buffer, empty data for treating time in the CU 700 are periodically added to the buffer (for example, at periods of 0.5 seconds). This empty data addition is performed by an internal timer in the buffer part. If the period is too short, system load increases or a large-capacity buffer is required, and if the period is too long, data reporting frequency may be decreased. Thus, it is necessary to select a proper period in consideration of such situations.

Here, the buffer is capable of hold data for a predetermined time. The predetermined time $(T_B)$ is determined based on a maximum delay time until data are sent to the CU 700 after the data are collected by a device such as the MC 300. For example, if the maximum delay time is 3 seconds, the predetermined time $(T_B)$ may be 4 seconds by adding $+\alpha$ of 1 second to the maximum delay time. Since the maximum delay time is varied according to the system ability, it is necessary to find a proper value and set the value as the maximum delay time. A delay time in the system is compensated for by the buffer.

Figure 27:
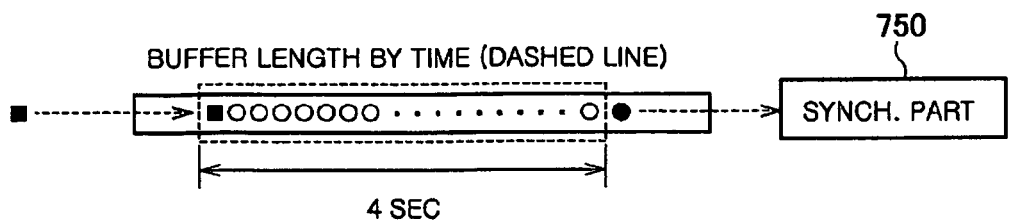
FIG. 27 is a view for explaining data insertion to a buffer according to the second embodiment of the present invention.

As shown in FIG. 27, the length (4 seconds) of a buffer is indicated in time by dashed lines. In a state where the capacity of the buffer is full, if new data are received and inserted into the buffer as indicated by the black rectangle, since the predetermined time $(T_B)$ indicating the capacity of the buffer is exceeded, the oldest data among buffer data indicated by white circles is output from the buffer (as indicated by the black circle) and sent to the synchronizing part 750. At this time, if empty data does not exist in the buffer, data of the buffer may not be properly processed and sent to the synchronizing part.

(2-5) Data Receiving Flow

Figure 28:
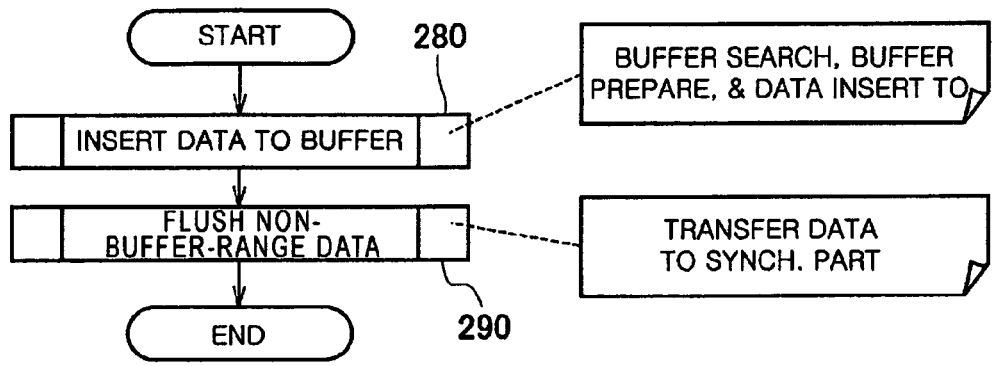
FIG. 28 is a flowchart for receiving data according to the second embodiment of the present invention.

FIG. 28 is a schematic flowchart for explaining data transmission by the buffer part 740.

When the buffer part 740 of the control program receives data, the buffer part 740 inserts the data in a buffer (step 280) and flushes non-buffer-range data (step 290). In step 280, searching a plurality of buffers, preparing a new buffer, and inserting data to a buffer are performed. Here, the term "non-buffer-range data" means data which are out of the range of a predetermined time (TB) set in a buffer.

Hereinafter, [Insertion of received data to buffer] and [Flush of non-buffer-range data] will be explained in detail.

(2-6) Insertion of Received Data to Buffer

Figure 29:
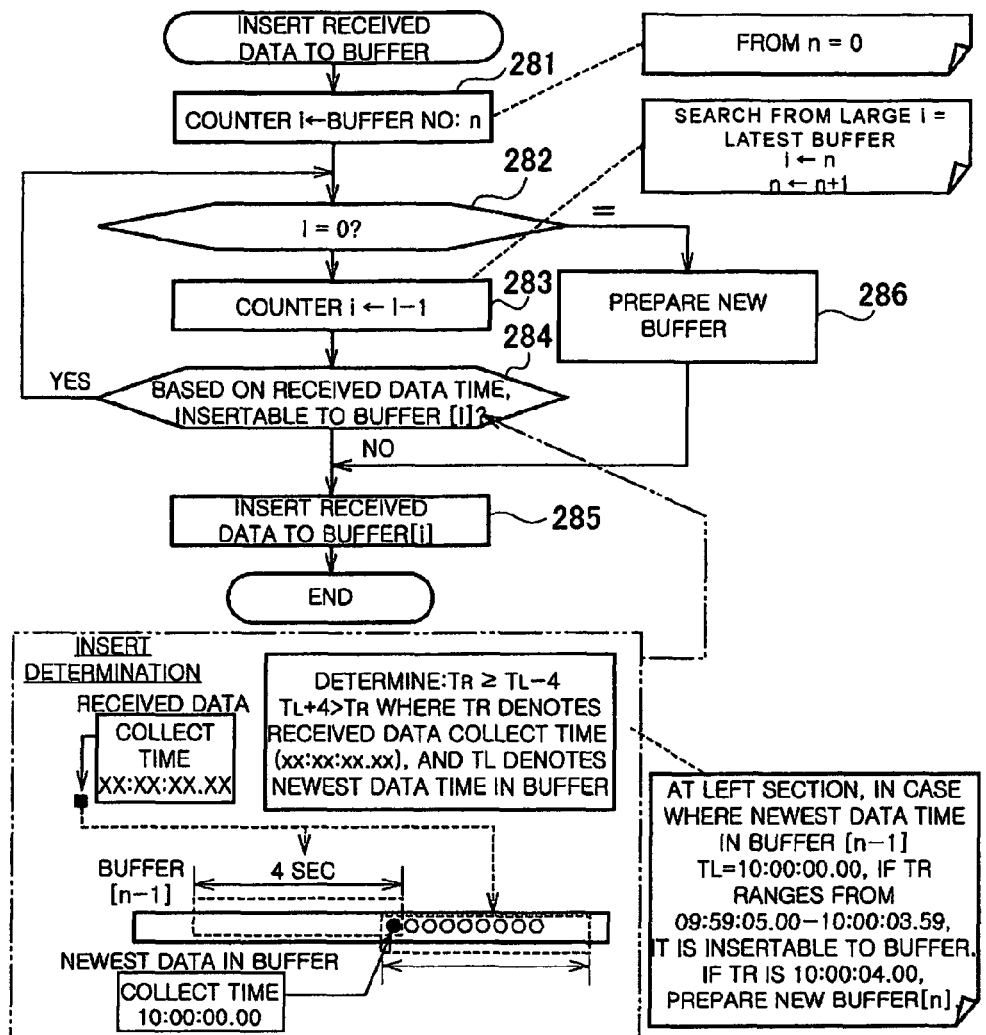
FIG. 29 is a flowchart for receiving data according to the second embodiment of the present invention.

With reference to FIG. 29, insertion procedures of step 280 (refer to FIG. 28) performed by the buffer part 740 will be explained in detail.

A counter (i) is set to a buffer number (n) (step 281). The initial value of (n) is "0." After set to (n), it is determined whether i=0 (step 282). If i=0, a new buffer is prepared, and then the counter (i) is set to "n" and "n" is substituted with "n+1" (step 286). Thereafter, insertion step 285 (described later) is performed. If "i" is not zero, counter (i) is set to "i−1" (step 283). After setting to "i−1," based on received data time, it is determined whether insertable to buffer [i] (step 284), and if it is not insertable, the procedure goes back to step 282. If it is insertable, received data is inserted to buffer [i] (step 285). Then, the insertion flow is terminated.

Step 284 will now be explained in detail with reference to the section enclosed by a one-dot chain line and entitled "insert determination."

The collect time of newly received data (indicated by a black-solid-line box), $T_R$, is XX: XX: xx.xx.

Since the data holding capacity of the buffer, that is, predetermined time $(T_B)$ is 4 seconds, if the received data collect time $T_R$ xx: xx: xx.xx is equal to or later than (newest data collect time $T_L$ in the buffer—4 seconds) but not later than (collect time $T_L$+4 seconds), it is determined that data are insertable to the buffer. That is, the buffer part 740 determines whether the received data collect time $T_R$ is in the following range:

$$T_R \geq T_L - 4$$

$$T_L + 4 > T_R$$

If the received data collect time $T_R$ is in the range, it is determined that data are insertable to the buffer.

For example, if newest data (indicated by a black rectangle) of newest buffer [n−1] has $T_L$=10: 00: 00.00, $$T_L - 4 = 10:00:00.00 - 00:00:04.00 = 09:59:56.00$$

$$T_L + 4 = 10:00:00.00 + 00:00:04.00 = 10:00:04.00$$

Therefore, if newly received data has a collect time $T_R$ in the range of 09: 59: 56.00~10: 00: 03.99, the buffer part 740 determines that data are insertable to the buffer [n−1]. If the received data collect time $T_R$ xx: xx: xx.xx is later than the newest data collect time of the buffer: 10: 00: 00.00, received data (indicated by a black rectangle) is inserted to a position (ranging in a 4-second length) after a position of the newest data (indicated by a black circle) in the buffer. If the received data collect time $T_R$ xx: xx: xx.xx is later than the newest data collect time of the buffer: 10: 00: 00.00, the received data (indicated by a black rectangle) is inserted to a position (ranging in a 4-second length) before the position of the newest data (indicated by a black circle) in the buffer. As described above, when it is determined whether data are insertable to a buffer, a range before and after 4 seconds from the newest data of the buffer is considered, and thus the data insertable range has a width of $2 \times T_B$ (4 seconds) with respect to the newest data of the buffer. That is, whether data can be stored in a buffer is determined based on each buffer time range of $2 \times T_B$.

In addition, if the received data collect time $T_R$ is 10: 00: 04.00, since the received data collect time $T_R$ exceeds the buffer time range of $2 \times T_B$=8 seconds, a new buffer [n] is prepared.

In the process of determining whether data are insertable to a buffer, since each buffer has a width of $2 \times T_B$ with respect to its newest data, management times of buffers may be overlapped with each other. Therefore, to prevent an overlap between buffer management times, the current embodiment provides a data time overlap preventing method as explained in the following sections (A) and (B).

(A) Processing Example for the Case where New Buffer is Temporally New

Figure 30:
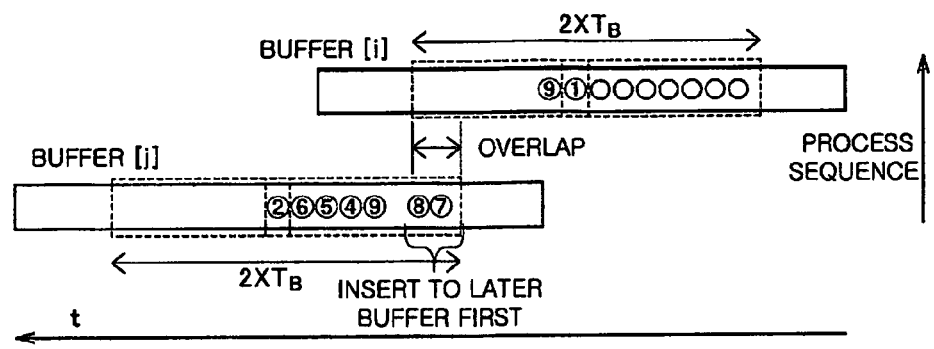
FIG. 30 is a view for explaining a buffer management time overlap according to the second embodiment of the present invention.

An explanation will now be given with reference to FIG. 30. Numerals enclosed by circles in FIG. 30 will be denoted in parenthesis "( )" in the following explanation for convenience. This is the same in descriptions of FIG. 31 and FIG. 34.

In a state where data (1) of a buffer [i] are the newest data, it is assumed that data (2) are received. If the collect time of the data (2) is later than the collect time of the data (1) plus $T_B$, a buffer [j] is prepared, and the data (2) are stored in the buffer [j]. Thereafter, it is assumed that data (3) to (8) are stored in the buffer [j] at positions before the position of the data (2) (due to their earlier collect times). In this case, although the data (7) and (8) are in a storage range of the buffer [i], they are stored in the buffer [j]. Thereafter, it is assumed that data (9) are received. If the collect time of the data (9) is earlier than the collect time of the data (2) of the buffer [j] minus $T_B$ but later than the collect time of the data (1) of the buffer [i], the data (9) are stored in the buffer [i]. In the exemplary case, since overlapping data are stored in the new buffer [j], there is no contradiction in data management.

(B) Processing Example for the Case where New Buffer is Temporally Old

Figure 31:
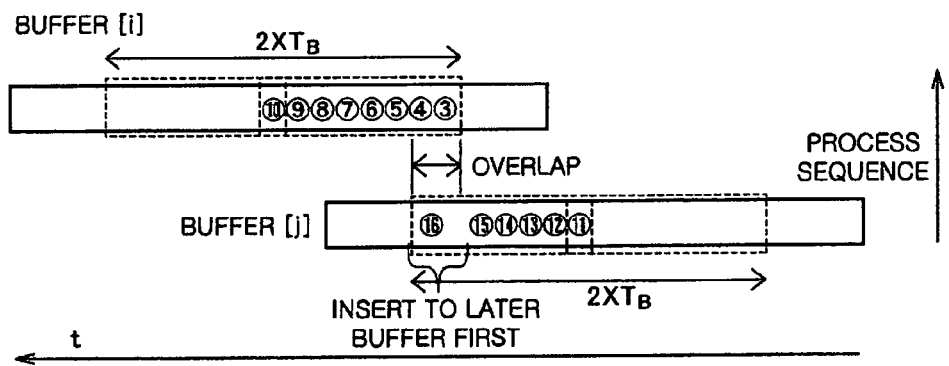
FIG. 31 is a view for explaining a buffer management time overlap according to the second embodiment of the present invention.

An explanation will now be given with reference to FIG. 31. In a state where data (10) of a buffer [i] are the newest data, it is assumed that data (11) are received. If the collect time of the data (11) is earlier than the collect time of the data (10) minus $T_B$, a buffer [j] is prepared, and the data (11) are stored in the buffer [j]. Thereafter, it is assumed that data (12) to (16) are stored in the buffer [j] at positions after the position of the data (11) (due to their later collect times). In this case, although the data (16) are in a storage range of the buffer [i], the data (16) are stored in the buffer [j]. In this case, since data (3) and (4) are stored in the buffer [i] at positions overlapped with the position of the data (16) in the buffer [j], it seems to be mismatch in data management. However, actually, the data (16) are newly received data in terms of time, and after about $T_B$ from the time the previously received data (data (3) or (4)) are flushed, the data (16) are flushed. In a flushing process (described in the next section), all data of a buffer are flushed except for $T_B$ time range data. Therefore, such a time overlap between data is always prevented. That is, mismatch does not occur in data management.

(2-7) Flush of Non-Buffer-Range Data

Figure 32:
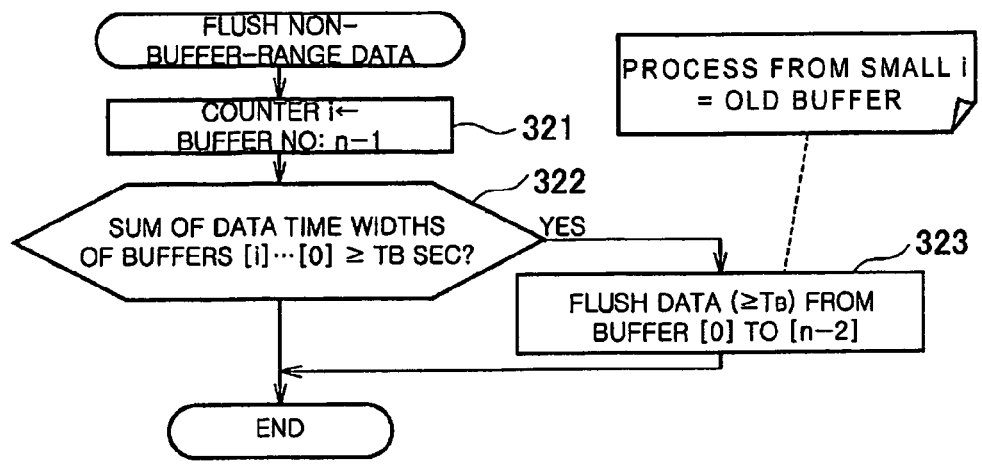
FIG. 32 is a flowchart for receiving data according to the second embodiment of the present invention.

With reference to FIG. 32, a detailed explanation will be given on a flushing process performed in step 290 (refer to FIG. 28) by the buffer part 740.

A counter (i) is set to a buffer number (n−1) (step 321). After that, it is determined whether the sum of data time widths of buffers [i], . . . , and [0] is equal to or greater than $T_B$ seconds (step 322). If not, the procedure is terminated without flushing. However, if there is such data, data having times equal to or greater than $T_B$ seconds are flushed in the order of buffers [0] to [n−2] (step 323), and then the procedure is terminated. In step 323, a buffer having a smaller (i) value, that is, an older buffer is first processed. The buffer [0] is the oldest buffer.

Next, in a flushing process, the time range of buffer management will be explained.

First, with reference to FIG. 33, a first specific example will be explained.

Figure 33:
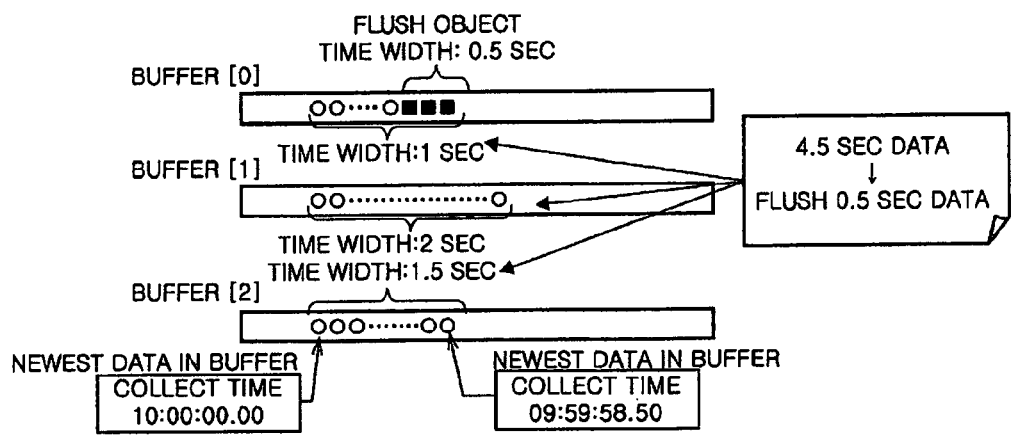
FIG. 33 is a view for explaining a buffer management time range according to the second embodiment of the present invention.

As shown in FIG. 33, in the example, there are three buffers ([0] to [2]), in which the time width between the newest data and the oldest data of the buffer [0] is 1 second, the time width between the newest data and the oldest data of the buffer [1] is 2 second, and the time width between the newest data and the oldest data of the buffer [2] is 1.5 second (in the buffer [2], the collect time of the newest data is 10: 00: 00.00, and the collect time of the oldest data is 09: 59: 58.50). In this case, the total data time of the buffers is 4.5 seconds, and thus there are data exceeding by 0.5 seconds with respect to $T_B$=4 seconds of the oldest buffer [0]. The exceeding data are denoted by black rectangles, and the exceeding data are to be flushed.

In the above-described process of storing data to a buffer, whether to store or not store is determined based on $2 \times T_B$ time of each buffer; however, in this process, $T_B$ time is managed as a buffer total. By this, the buffer total management time $T_B$ can be maintained to transmit data to the synchronizing part 750 without stop.

Figure 34:
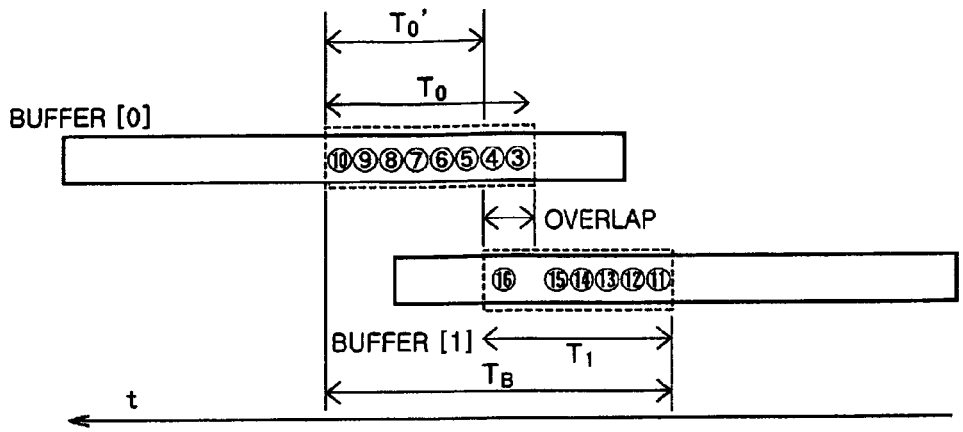
FIG. 34 is a view for explaining a buffer management time range according to the second embodiment of the present invention.

Furthermore, with reference to FIG. 34, a second specific example will now be explained. In the specific example of FIG. 34, only two buffers are shown like in FIG. 31. If the management time range of buffer [i]=buffer [0] is $T_0$, and the management time range of buffer [j]=buffer [1] is $T_1$, the following formulas are satisfied before the process of [flush of non-buffer-range data].

$$T_0 \leq 2 \times T_B$$

$$T_1 2 \times T_B$$

In this state, if the flushing process explained in FIG. 32 and FIG. 33 is performed, data time remaining in the buffer [0] is as follows.

$$T_0' = T_B - T_1$$

Thus, data of $(T_0 - T_0')$ time range (in the example, data (3) and (4)) are pushed out.

If the time data of data (11) caused to make the buffer [1] is considered, since the time range between data (10) and (11) is equal to or greater than $T_B$, old data (3) and (4) are flushed when data such as data (16) overlapped with the previous buffer is input.

In the above explanation, it is explained that although received data are not input, empty data are added at predetermined intervals (for example, 0.5 seconds) for properly processing buffer data. This addition of empty data is performed according to the above-described processing flow.

In the processing flow, if newly received data cannot be stored in any buffer because the collect time $T_R$ of the newly received data exceeds $2 \times T_B$ of each buffer, a new buffer is prepared. Generally, a new buffer is prepared when there is a time variation; however, if all units are synchronized within a predetermined time $T_B$ (4 seconds), only two buffers are necessary. In the case that the system needs three or more buffers, although $T_B$ can be readjusted, it is preferable that synchronization of units, and the processing time difference between indirect data (C1) and direct data (C2) or transmission delay of C1 data be treated for improvement.

(2-8) Synchronizing Part

The synchronizing part 750 is configured to synchronize timing for updating a monitor data storage region with timing for collecting trace data without using system time but using internal system time (synchronizing time) of the synchronizing part 750. Hereinafter, the process of the synchronizing part 750 will be described with reference to FIG. 35.

Figure 35:
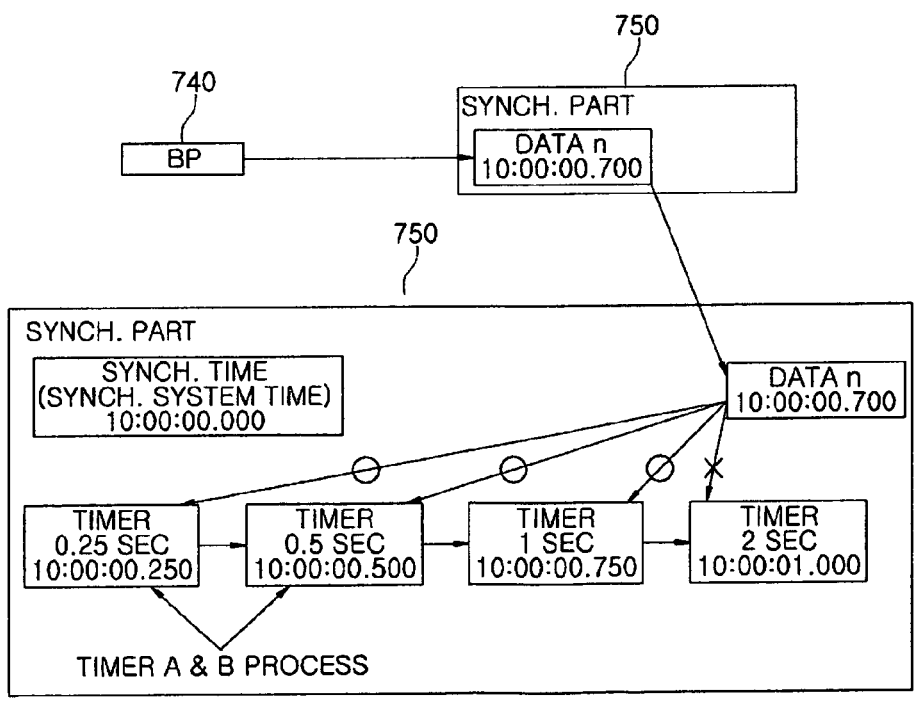
FIG. 35 is a view illustrating a synchronizing part according to the second embodiment of the present invention.

As shown in FIG. 35, the synchronizing part 750 is operated by timers, and if data (n) are sent from the buffer part 740, the synchronizing part 750 checks the time of the data (10: 00: 00.700). At the checking process, it is checked that which of timers A (0.25 seconds), B (0.5 seconds), C (1.0 second), D (2.0 seconds), . . . of the synchronizing part 750 can generate timing between the time (10: 00: 00.700) and the system time (synchronizing time) in the synchronizing part 750 (10: 00: 00.000). In addition, "n" of data (n) means a data name such as temperature or pressure. In addition, the timers A, B, C, D, . . . indicate report data periods.

In the illustrated example, since the timers A and B between the synchronizing time (10: 00: 00.000) and the data (n) time (10: 00: 00.700) can be processed, timer processing is carried out in the order of timers A and B. The timers are coupled to, for example, a trace of a data collection plan (DCP) so that data collection or transmission can be performed upon a timing generation. DCP is a plan defined by a client to collect or set desired data, and information such as numbers, combined information, and frequency of trace data, events, and exceptions are written in the DCP.

Figure 36:
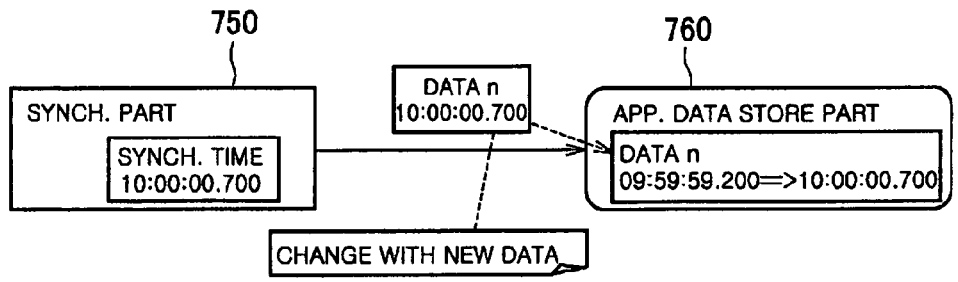
FIG. 36 is a view for explaining data recording from the synchronizing part to an apparatus data store region according to the second embodiment of the present invention.

As shown in FIG. 36, after all timers of the synchronizing part 750 that can be processed are generated, the synchronizing time is updated with the data (n) time (10: 00: 00.700), and the new data (n) (10: 00: 00.700) are stored in the data store part 760 on a preceding data (n) (09: 59: 59.200).

(2-9) Data Report Part

Figure 37:
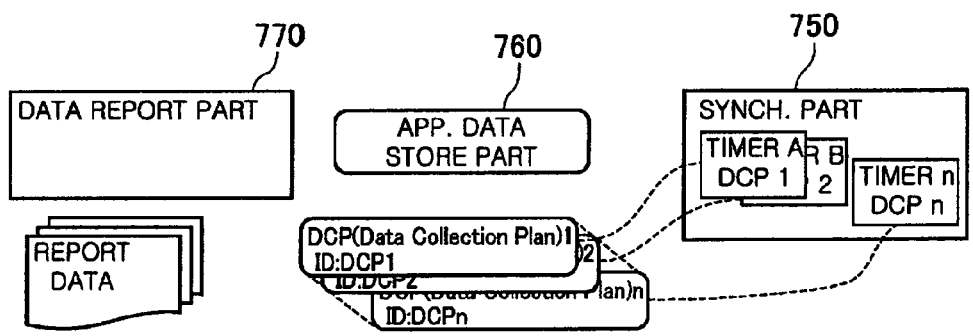
FIG. 37 is a view illustrating a data report part according to the second embodiment of the present invention.

As shown in FIG. 37, the data report part 770 is operated by the timers A, B, . . . , and n of the synchronizing part 750 which become processable. Timers can recognize related DCP by using information such as ID. DCPs (DCP1, DCP2, . . . and DCPn) have IDs (DCP1, DCP2, . . . DCPn), and thus IDs may be provided to the timers so that the timers can recognize the DCPs according to the IDs. According to the description of DCPs, the data report part 770 collects necessary data from the apparatus data storage 760 and prepares/transmits report data.

Until now, processes using buffers are explained. In the processing method, it may seem that a report to the DB 800 is incorrect; however, since a preparation time included in report data is exactly in accordance with the time interval requested by the DCP. Therefore, finally, exact data can be acquired according to collect times in the apparatus system without contradiction by analyzing data of the DB 800.

(2-10) Packing Data

As described above, it is required to collect data from an apparatus system with high precision, and thus to satisfy such requirement, a method of packing a certain kind of data collected for a predetermined period can be easily thought out. According to the above-described second data report method 2, packing data can also be inserted to a buffer at proper positions according to the collect time of the packing data, and thus report data to the DB can be prepared and sent without contradiction.

Hereinafter, this will be explained below.

Figure 38:
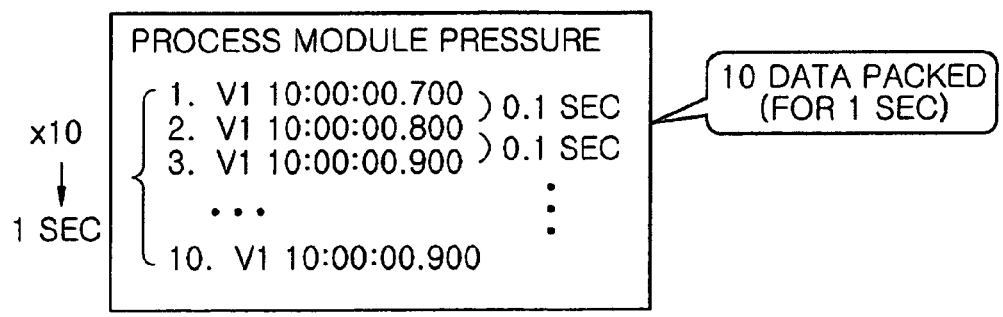
FIG. 38 is a view illustrating an example of packing data according to the second embodiment of the present invention.
Figure 39:
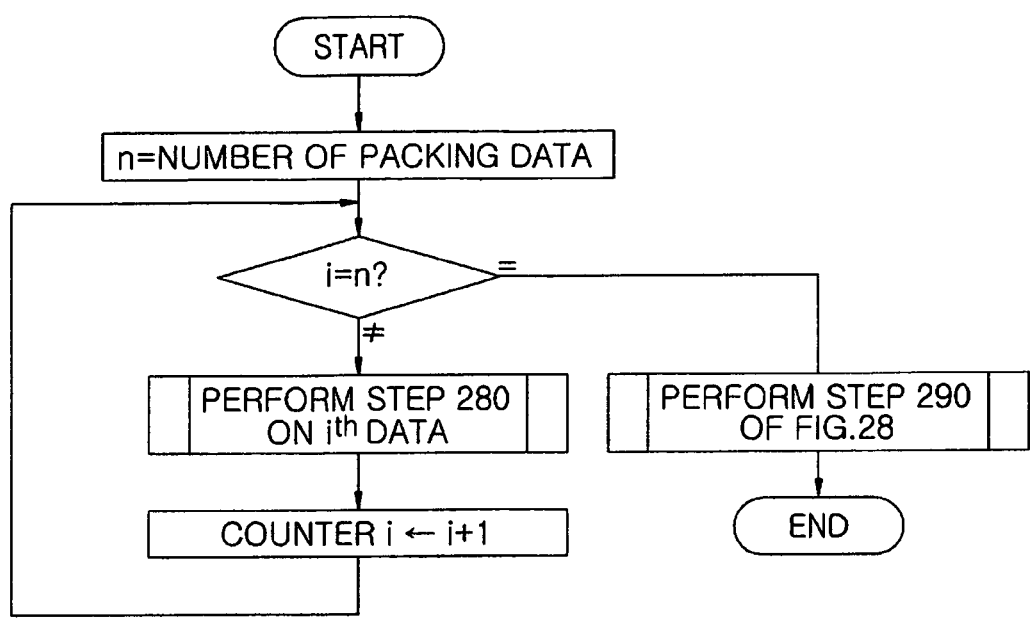
FIG. 39 is an exemplary flowchart for receiving packing data according to the second embodiment of the present invention.

FIG. 38 illustrates an example of packing data including ten pieces of process module pressure data each collected for 1 second at intervals of 0.1 second. The plurality of pieces of data may be sequentially processed as described in FIG. 28. After inserting packing data, step 290 of FIG. 28 may be performed. FIG. 39 illustrates a data receiving flow of the buffer part 740 in the case where packing data and non-packing data exist together.

(2-11) Effects of Second Embodiment

According to the current embodiment, the occurrence time of various data generated from the substrate processing system, or matching between collected data can be managed. In addition, according to the current embodiment, since there is no dependence on data sources, various data can be easily managed. In addition, according to the current embodiment, the semiconductor manufacturing apparatus system can provide data properly to the semiconductor manufacturing factory side, and thus the data can be analyzed at the semiconductor manufacturing factory side.

In the first and second embodiments, a film-forming process is taken as an example of a substrate processing process. Examples of such a film-forming process include a CVD process, a PVD process, an oxide film forming process, a nitride film forming process, and a metal-containing film forming process. In addition, the pressure can be applied to other processes such as an annealing process, an oxidation process, a nitriding process, and a diffusion process. Furthermore, although a vertical substrate process apparatus is taken as an example of a substrate processing apparatus, the pressure can be applied to a single wafer type substrate processing apparatus. Moreover, examples of such a substrate processing apparatus include an exposing apparatus, a coating apparatus, a drying apparatus, and a heating apparatus, as well as a semiconductor manufacturing apparatus.

According to the present invention, the occurrence order of various data generated from a substrate processing system, or matching between the data can be managed, and thus proper data can be provided from a semiconductor manufacturing apparatus to a system of a semiconductor manufacturing factory. Therefore, the system of the semiconductor manufacturing factory can analyze the data properly.

Supplementary Note: the present invention also includes the following embodiments.

According to an embodiment of the present invention, there is provided a substrate processing system comprising: a substrate processing apparatus comprising a plurality of components; a controller configured to control the substrate processing apparatus by setting a sequence prescribing time and components; and a collection unit configured to collect data directly from the components without involving the controller, wherein the collection unit is configured to match data collected from the components through the controller with data collected directly from the components.

In the substrate processing system, it is preferable that the collection unit be configured to accumulate the data directly collected from the components and match the accumulated data with data collected from the components through the controller.

Furthermore, in the substrate processing system, it is preferable to accumulate data obtained by dividing a maximum delay time assumed to be the difference between a collect time at the controller and a receiving time at the collection unit by a minimum collection period time of the controller.

Furthermore, in the substrate processing system, it is preferable that the collection unit be configured to temporarily accumulate the data collected from the components via the controller and the data collected directly from the components, and arrange the data according to added time data.

According to another embodiment of the present invention, there is provided a data collecting method using a substrate processing system comprising: a substrate processing apparatus comprising a plurality of components; a controller configured to control a substrate processing sequence prescribing time and components to perform a substrate processing process; a terminal device configured to collect data generated from the components through the controller; and a collection unit configured to collect data directly from the components without involving the controller, wherein the data collecting method comprises performing a matching process by using the collection unit so as to match data collected from the components via the controller with data collected directly from the components.

According to another embodiment of the present invention, there is provided a data collection apparatus comprising: a substrate processing apparatus comprising a plurality of components; a controller configured to control a substrate processing sequence prescribing time and components to perform a substrate processing process; a terminal device configured to collect data generated from the components through the controller; and a collection unit configured to collect data directly from the components without involving the controller, wherein the collection unit is configured to match data collected from the components via the controller with data collected directly from the components.

According to another embodiment of the present invention, there is provided a substrate processing system comprising a collection unit configured to collect data generated from a plurality of components indirectly through controllers and/or directly from the components without involving controllers, wherein the collection unit comprises: a part configured to match the collected data; a buffer configured to store the matched data temporarily; and a part configured to arrange the data stored in the buffer according to time data added to the data.

In the substrate processing system, if the components do not generate data for a predetermined time when the collection unit collects data from the components, it is preferable that the collection unit store empty data containing only time data in the buffer.

What is claimed is:

1. A substrate processing system comprising a collection unit configured to collect data generated from a plurality of components indirectly through controllers, the collection unit comprising:
    a buffer configured to store a collected data for a predetermined time so as to absorb a delay occurring when collecting data indirectly through the controllers; and
    a part configured to arrange the collected data stored in the buffer according to a collected time,
    wherein the collected data is stored in the buffer when the collected time of the collected data is within a predetermined range from a newest collected time and the collected data is stored in a new buffer when the collected time of the collected data is out of the predetermined range.

2. A substrate processing system comprising a collection unit configured to collect data generated from a plurality of components indirectly through controllers, the collection unit comprising:
    a first part configured to report a collected data;
    a buffer configured to store a collected data for a predetermined time so as to absorb a delay occurring when collecting data indirectly through the controllers; and
    a second part configured to arrange the collected data stored in the buffer according to a collected time,
    wherein the collected data is stored in the buffer when the collected time of the collected data is within a predetermined range from a newest collected time and the collected data is stored in a new buffer when the collected time of the collected data is out of the predetermined range.

3. The substrate processing system of claim 2, wherein the collection unit is further configured to collect and match a first data and a second data, the first data being indirectly collected from the plurality of components via the controller and the second data being collected directly from the plurality of components, and
    wherein the collection unit is further configured to temporarily accumulate the first data and the second data and to arrange the first data and the second according to time data included in each of the first data and the second data.

4. The substrate processing system of claim 2, wherein the collection unit is further configured to collect and match a first data and a second data, the first data being indirectly collected from the plurality of components via the controller and the second data being collected directly from the plurality of components, and
    wherein the collection unit further comprises:
    a third part configured to match the first data and the second data;
    wherein the buffer is further configured to temporarily store the first data and the second data matched by the first part; and
    a fourth part configured to arrange the first data and the second data stored in the buffer according to time data included in each of the first data and the second data.

5. The substrate processing system of claim 4, wherein the collection unit stores in the buffer an empty data containing only the time data when the plurality of components do not generate any data for a predetermined time.

* * * * *